United States Patent [19]

Tsukamoto et al.

[11] Patent Number: 4,855,953
[45] Date of Patent: Aug. 8, 1989

[54] SEMICONDUCTOR MEMORY DEVICE HAVING STACKED MEMORY CAPACITORS AND METHOD FOR MANUFACTURING THE SAME

[75] Inventors: Katsuhiro Tsukamoto; Masahiro Shimizu; Kazuyasu Fujishima; Yoshio Matsuda, all of Hyogo, Japan

[73] Assignee: Mitsubishi Denki Kabushiki Kaisha, Tokyo, Japan

[21] Appl. No.: 158,323

[22] Filed: Feb. 19, 1988

[30] Foreign Application Priority Data

| Feb. 25, 1987 | [JP] | Japan | 62-43422 |
| Feb. 25, 1987 | [JP] | Japan | 62-43423 |
| Feb. 25, 1987 | [JP] | Japan | 62-43424 |
| Feb. 25, 1987 | [JP] | Japan | 62-43425 |
| Feb. 26, 1987 | [JP] | Japan | 62-44275 |
| May 19, 1987 | [JP] | Japan | 62-122024 |

[51] Int. Cl.$^4$ .................... G11C 13/00; G11C 11/40
[52] U.S. Cl. ........................ 365/149; 365/51; 357/40
[58] Field of Search ............ 365/51, 149, 189; 357/40

[56] References Cited

U.S. PATENT DOCUMENTS 4,742,018  5/1988  Kimura et al. .................. 365/149

Primary Examiner—Terrell W. Fears
Attorney, Agent, or Firm—Lowe, Price, LeBlanc, Becker & Shur

[57] ABSTRACT

A dynamic RAM comprises an array of memory cells, each of the memory cells comprising a single access transistor and a charge storage region. The charge storage region comprises a first capacitor memory including a P+ region serving as an opposite electrode formed in the inner surface of a trench formed in a P type silicon substrate, a first capacitor dielectric film formed on the P+ region and a common electrode layer serving as a memory terminal formed on the first capacitor dielectric film, and a second memory capacitor including the common electrode layer, a second capacitor dielectric film formed on the common electrode layer and a cell plate electrode formed on the second capacitor dielectric film. The memory terminal and a drain region of the access transistor are connected in a self-aligning manner by an electrode having a sidewall shape which is in contact with an end of the memory terminal. Thus, a contact hole need not be formed in the first capacitor dielectric film, so that decrease of the electrical reliability of the first capacitor dielectric film can be prevented. The drain region of the access transistor may be formed by self-alignment with the contact portion of the common electrode layer.

30 Claims, 19 Drawing Sheets

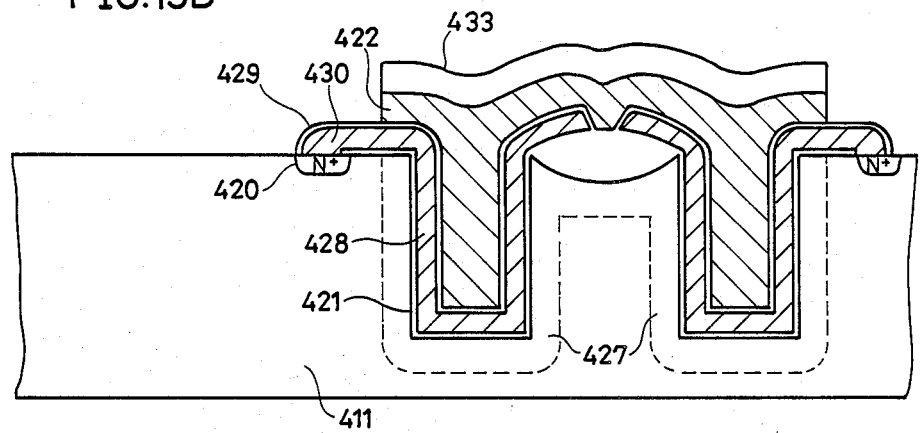
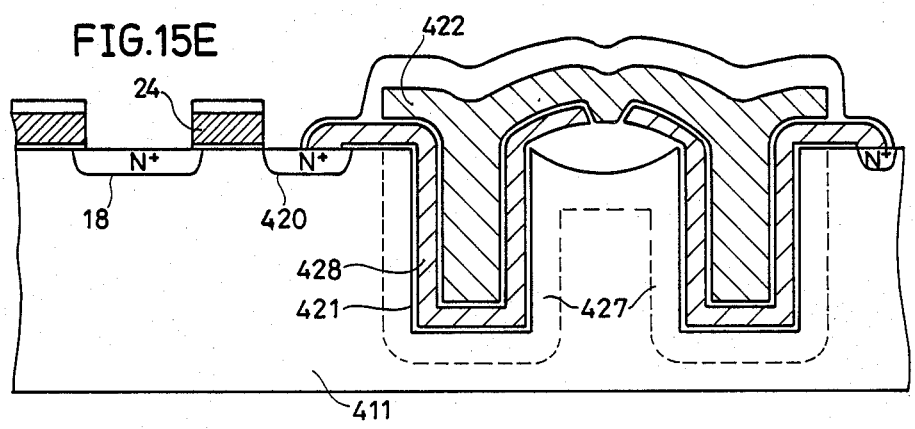
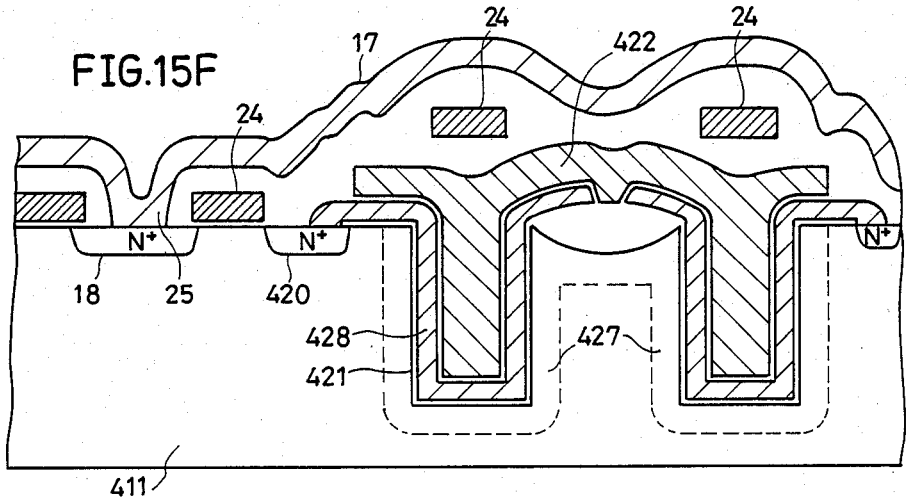

SEMICONDUCTOR MEMORY DEVICE HAVING STACKED MEMORY CAPACITORS AND METHOD FOR MANUFACTURING THE SAME

BACKGROUND OF THE INVENTION

1. Field of the Invention

The present invention relates to a semiconductor memory device and a method for manufacturing the same and more particularly, to a capacitor structure having high density in a dynamic random access memory (DRAM) array and a method for manufacturing the same.

2. Description of the Prior Art

Recently, significant progress has been made in a semiconductor memory device. For example, in a random access memory (RAM), various attempts to provide high integration density have been made without decreasing storage characteristics thereof.

FIG. 1 is a block diagram showing an example of a structure of a general RAM. Referring to FIG. 1, a plurality of word lines and a plurality of bit lines are arranged to intersect with each other in a memory cell array 1, a memory cell (not shown) being provided at each of intersections of the word lines and the bit lines. A particular memory cell is selected based on an intersection of a single word line selected by an X address buffer decoder 2 and a single bit line selected by a Y address buffer decoder 3. Data is written to the selected memory cell or data stored in the memory cell is read out. Write/read operation of the data is specified by a read/write control signal (R/W) applied to an R/W control circuit 4. At the time of writing data, input data (Din) is inputted to the selected memory cell through the R/W control circuit 4. On the other hand, at the time of reading out data, the data stored in the selected memory cell is detected and amplified by a sense amplifier 5 and outputted to the exterior through a data output buffer 6 as output data (Dout).

FIG. 2 is an equivalent circuit diagram of a dynamic memory cell shown for explaining write/read operation of a memory cell.

Referring to FIG. 2, each dynamic memory cell comprises a single field effect transistor 8 and a single capacitor 9. The field effect transistor 8 has one conduction terminal connected to one of the electrodes of the capacitor 9 and another conduction terminal connected to a bit line 7. In addition, the transistor 8 has a gate electrode connected to a word line 10. The capacitor 9 has other electrode connected to ground. At the time of writing data, since a predetermined potential is applied to the word line 10 so that the field effect transistor 8 is rendered conductive, charge from the bit line 7 is stored in the capacitor 9. On the other hand, at the time of reading out data, since a predetermined potential is applied to the word line 10 so that the field effect transistor 8 is rendered conductive, charge stored in the capacitor 9 is extracted through the bit line 7. As is obvious from the foregoing, storage capacity of a memory cell is based on the capacitance of its capacitor 9. Thus, in order to provide high integration of a memory cell array, various attempts to maintain and increase capacitance of each memory capacitor have been made. Such attempts are disclosed in, for example, Japanese Patent Publication Nos. 56266/1983 and 55258/1986 and Japanese Patent Laying-Open Gazette No. 65559/1985. As one kind of such attempts, a trench memory cell has been developed in which a trench is formed in a semiconductor substrate an a charge storage region is formed in the inner surface of the trench so that storage capacity can be maintained or increased.

FIG. 3 is a plan view of a dynamic RAM using such a trench memory cell, and FIG. 4 is a cross sectional view taken along a line A-A shown in FIG. 3. The trench memory cell is disclosed in, for example, an article by H. Sunami et al., entitled "A Corrugated Capacitor Cell", IEEE Trans. Electron Devices, Vol. ED-31, pp. 746–753.

Referring to FIGS. 3 and 4, a plurality of memory cells 12 are formed on the surface of a type silicon substrate 11. In FIG. 3, each of the memory cells 12 corresponds to a section formed by a dot and dash line. The adjacent memory cells 12 are isolated by an isolation field oxide film 13. A channel stop P+ region 14 for isolation is formed under the field oxide film 13. Each of the memory cells 12 comprises a charge storage region 15 for storing charges, an access transistor region 16 and an N+ region 18 connected to a bit line 17. More specifically, the charge storage region 15 comprises a trench 19 formed in the major surface of the P type silicon substrate 11, an N+ region 20 formed in a part of the major surface of the P type silicon substrate 11 including the inner surface of the trench 19 and serving as a memory terminal of a memory capacitor, a capacitor dielectric film 21 formed to cove the inner surface of the trench 19, and a cell plate electrode 22 formed on the capacitor dielectric film 21 and serving as an opposite electrode of the memory capacitor. In addition, the access transistor region 16 comprises N+ regions 18 and 20, a channel region 23 formed therebetween, and a word line 24 constituting a gate electrode. The bit line 17 is connected to the N+ region 18 through a contact hole 25.

Referring now to FIG. 4, description is made on write/read operation of data stored in the memory cell 12. At the time of writing data, since a predetermined potential is applied to the word line 24 so that an inversion layer is formed in the channel region 23, the N+ regions 18 and 20 are rendered conductive. Thus, charge from the bit line 17 is transferred to the charge storage region 15 through the channel region 23 and stored in the N+ region 20. On the other hand, at the time of reading out data, a predetermined potential is applied to the word line 24 so that the charge stored in the N+ region 20 is provided to the exterior through the inverted channel region 23, the N+ region 18 and the bit line 17.

The amount of charges thus stored depends on the area of the N+ region 20 formed in the inner surface of the trench 19, and formation of the trench 19 can contribute to formation of large charge storage capacitance while preventing increase of the planar area occupied by the charge storage region 15. More specifically, the trench 19 is formed and a trench capacitor using the trench 19 is used, so that a memory capacitor having a relatively large capacitance can be ensured while maintaining the area occupied by very fine memory cells.

However, the dynamic RAM shown in FIGS. 3 and 4 presents the following problems with respect to high integration density.

More specifically, in the conventional dynamic RAM, the P type silicon substrate 11 is set to be at a negative potential (about $-3V$). In addition, a potential of about 5V or about 0V is applied to the N+ region 20 (20a, 20b) serving as a charge storage region in response to memory information "1" or "0". Thus, a reverse bias voltage is usually applied between the N+ regions 20a and 20b and the P type silicon substrate 11 irrespective of the memory information. As a result, depletion regions 26a and 26b are formed around the N+ regions 20a and 20b. The higher the reverse bias voltage is or the lower the impurity concentration of the P type silicon substrate 11 is, the more easily the depletion regions 26a and 26b expand. Since the impurity concentration of the P type silicon substrate 11 is generally decreased with distance from the major surface, the depletion layers 26a and 26b as represented by a dotted line in FIG. 4 expand. As a result, when it is desired to form the trenches 19a and 19b deep to increase storage capacity, the distance [the distance a represented by an arrow in FIG. 4) between the adjacent depletion regions 26a and 26b is further reduced. In addition, it is obvious that the distance is also reduced if the positions where the trenches 19a and 19b are formed are close to each other for high integration density. Thus, when the adjacent trenches 19a and 19b are close to each other and the trenches 19a and 19b are formed deeper for higher integration, a punch-through phenomenon finally occurs in which the depletion regions 26a and 26b come in contact with each other (a=0). When such a punch-through phenomenon occurs, conduction between adjacent memory cells occurs, so that charges stored in the N+ regions 20a and 20b interfere with each other due to the difference in memory information stored in the adjacent memory cells. As a result, the information holding characteristic is deteriorated. More specifically, it becomes difficult to decrease the spacing between the adjacent trenches 19a and 19b and form the trenches deeper, which presents a large difficulty in providing high integration of memory cells.

Additionally, in the dynamic RAM shown in FIGS. 3 and 4, a memory terminal of the memory capacitor comprises the N+ region 20 in the P type silicon substrate 11. Thus, carriers produced upon incidence of radioactive rays, such as alpha rays, into the silicon substrate flow into the N+ region 20 serving as a memory terminal of the memory capacitor, so that a malfunction (referred to as soft error hereinafter) occurs in which original memory information is inverted.

SUMMARY OF THE INVENTION

Accordingly, one object of the invention is to provide a semiconductor memory device having high integration density without deterioration of the operating characteristics thereof.

Another object of the invention is to provide improved isolation between cells of a stacked capacitor type memory array.

An additional object of the invention is to provide a stacked capacitor type memory array that is easily manufactured.

A further object is to provide a memory cell comprising a single transistor and stacked capacitor wherein interconnection between the transistor and stacked capacitor is improved.

Briefly stated, a semiconductor memory device according to the present invention comprises a plurality of memory cells formed on a semiconductor substrate of a first conductivity type, each of the memory cells comprising charge storage means, a read/write transistor, and means for connecting the charge storage means and the transistor. The charge storage means comprises first and second memory capacitors stacked on the semiconductor substrate to be opposed to each other with a common electrode layer interposed therebetween. The read/write transistor comprises an electrode region of a second conductivity type formed on the surface of the semiconductor substrate. The connecting means comprises a contact portion of the common electrode layer connecting the common electrode layer to the electrode region of the read/write transistor.

In accordance with another aspect of the present invention, an electrode region of a read/write transistor is beneath and in registration with a contact portion of a common electrode layer.

In accordance with still another aspect of the present invention, a contact portion of a common electrode layer is coplanar with an electrode region of a read/write transistor.

In accordance with still another aspect of the present invention, common electrode layers of adjacent ones of charge storage means are spaced apart from each other on a semiconductor substrate, and the semiconductor memory device includes an isolation region formed by an insulating material on the semiconductor substrate between the common electrode layers.

In accordance with still another aspect of the present invention, connecting means comprises a contact portion of a common electrode layer self aligned and connected to an electrode region of a read/write transistor.

In accordance with still another aspect of the present invention, a method for manufacturing the semiconductor memory device comprises the steps of forming an electrode layer on a common electrode layer on a semiconductor substrate and an electrode region of a second conductivity type of a read/write transistor and etching the electrode layer so that an electrode having a sidewall shape which is in contact with an end of the common electrode layer is left on the above described electrode region of the second conductivity type.

In accordance with still another aspect of the present invention, the semiconductor memory device comprises a semiconductor layer of a first conductivity type formed on a semiconductor substrate as the same layer as a common electrode layer in charge storage means and a read/write transistor formed in the semiconductor layer, one of electrode regions of a second conductivity type of the transistor being connected to the above described common electrode layer.

In accordance with still another aspect of the present invention, a method for manufacturing the semiconductor memory device comprises the steps of forming simultaneously a common electrode layer on a capacitor dielectric film of a first memory capacitor in charge storage means and a semiconductor layer of a first conductivity type on the other region of a semiconductor substrate, and forming a read/write transistor in the semiconductor layer of the first conductivity type.

In accordance with still another aspect of the present invention, the semiconductor memory device comprises an electrode layer formed on a semiconductor substrate as the same layer as a common electrode layer in charge storage means, electrode regions of a read/write transistor being formed in a semiconductor substrate under the electrode layer.

In accordance with still another aspect of the present invention, a method for manufacturing the semiconductor memory device comprises the steps of forming simultaneously as the same layer a common electrode layer on a dielectric film of a first memory capacitor in charge storage means and an electrode layer on the other region of a semiconductor substrate, implanting impurities of a second conductivity type into the electrode layer, diffusing impurities of the second conductivity type in the electrode layer into the semiconductor substrate by heat treatment and thereby forming an electrode region of a read/write transistor under the electrode layer.

Thus, a principal advantage of the present invention is that a contact hole need not be formed in a capacitor dielectric film of a memory capacitor, so that it is not likely that the electrical reliability of the capacitor dielectric film is decreased and the area occupied by memory cells can be further reduced.

These objects and other objects, features, aspects and advantages of the present invention will become more apparent from the following detailed description of the present invention when taken in conjunction with the accompanying drawings.

BRIEF OF THE DRAWINGS

FIG. 1 a diagram showing an example of a structure of a RAM;

FIG. 2 equivalent circuit diagram of a dynamic memory cell;

Figure 12:
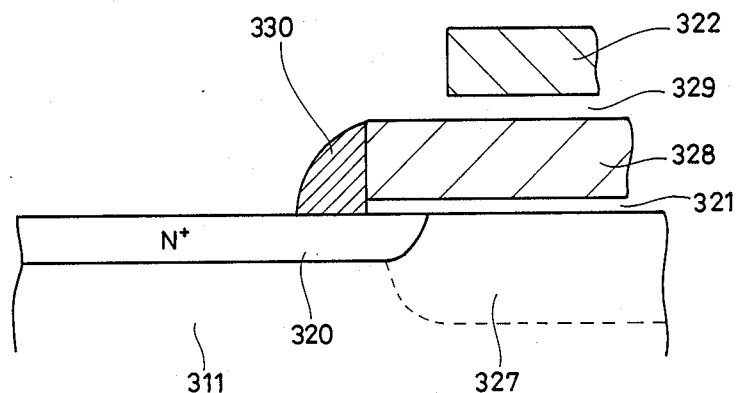
Figure 8:
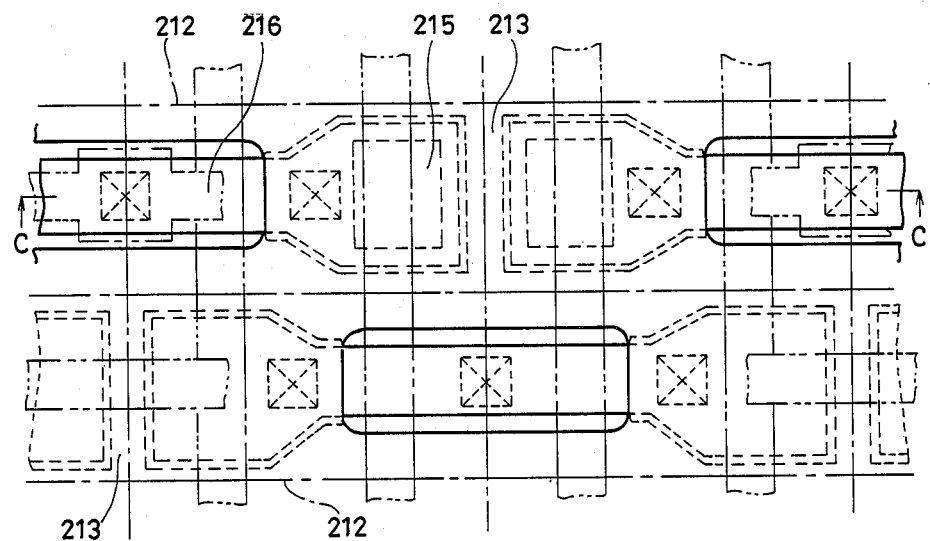
FIG. 8 is a plan view of a dynamic RAM according to another embodiment of the present invention.
Figure 9:
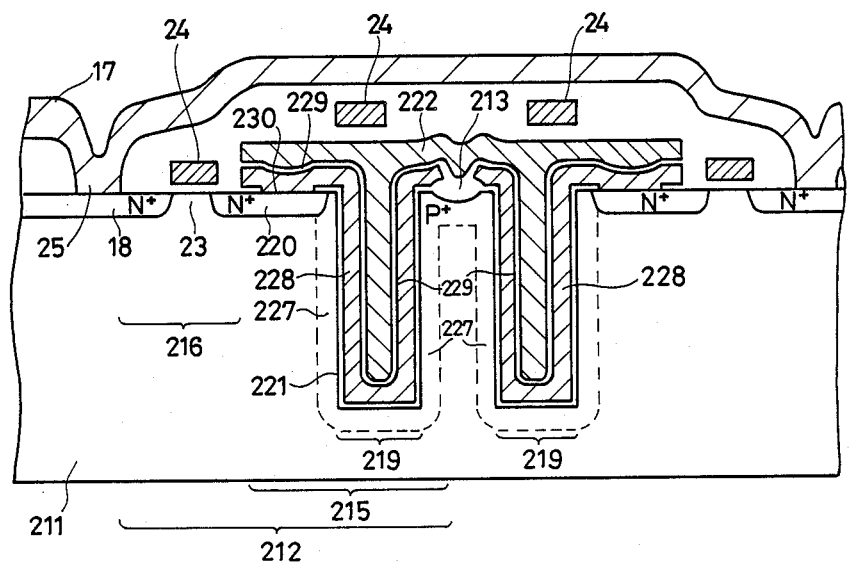
Figure 10:
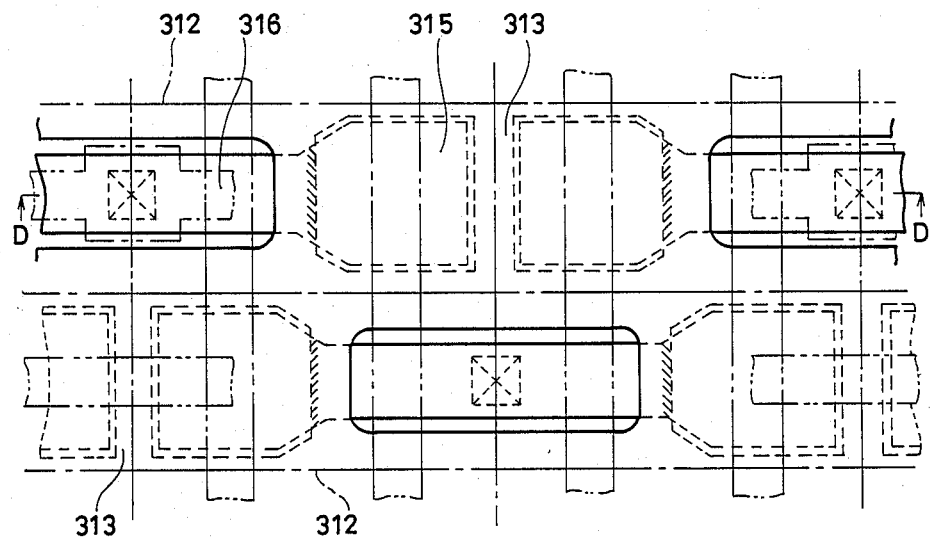
Figure 11:
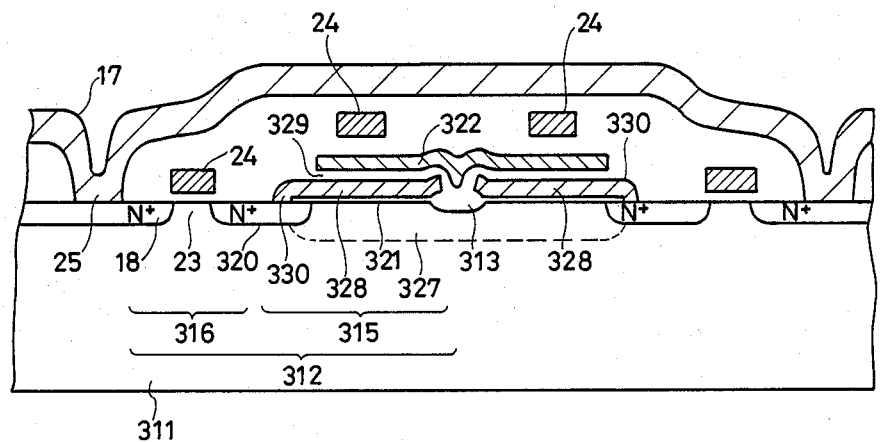
Figure 13:
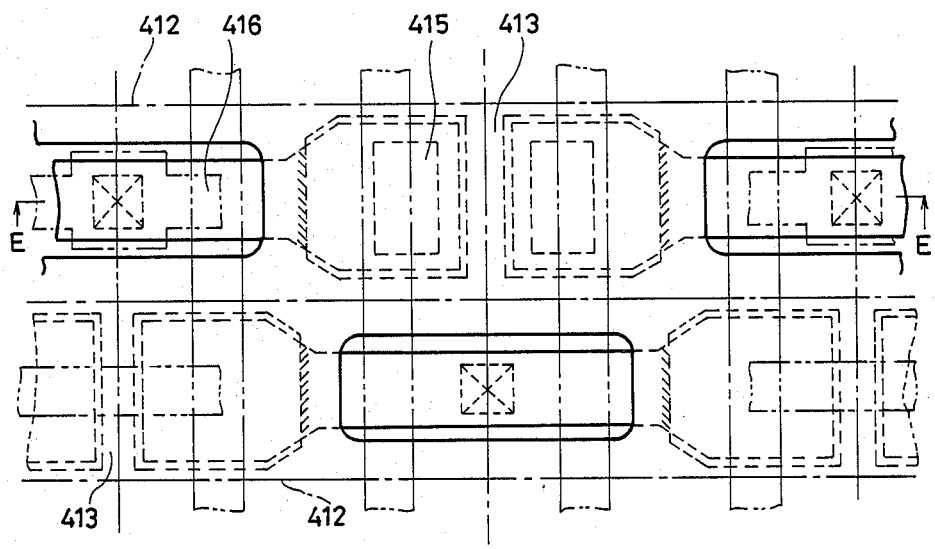
Figure 14:
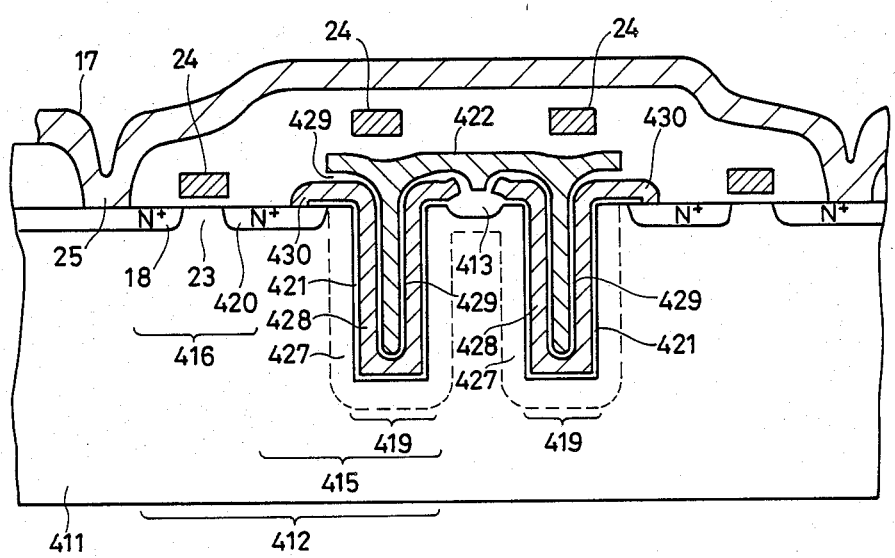
Figure 16:
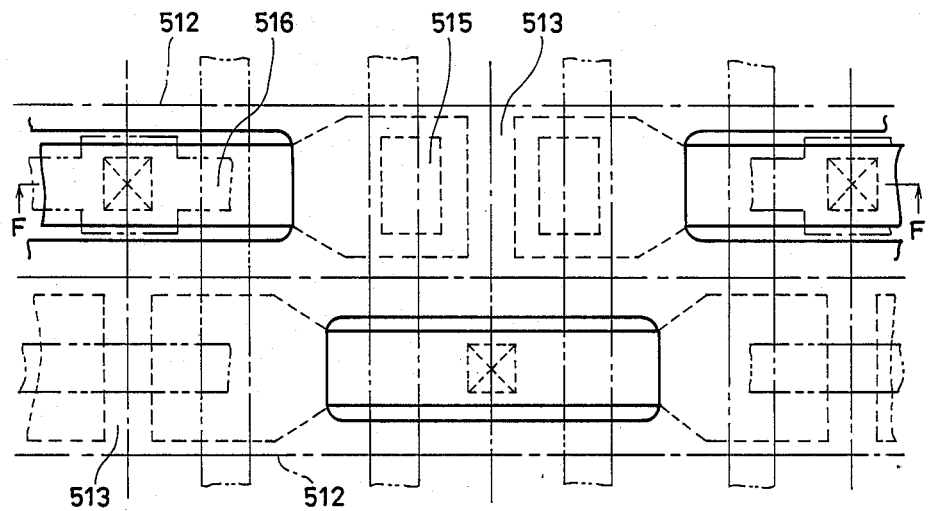
Figure 17:
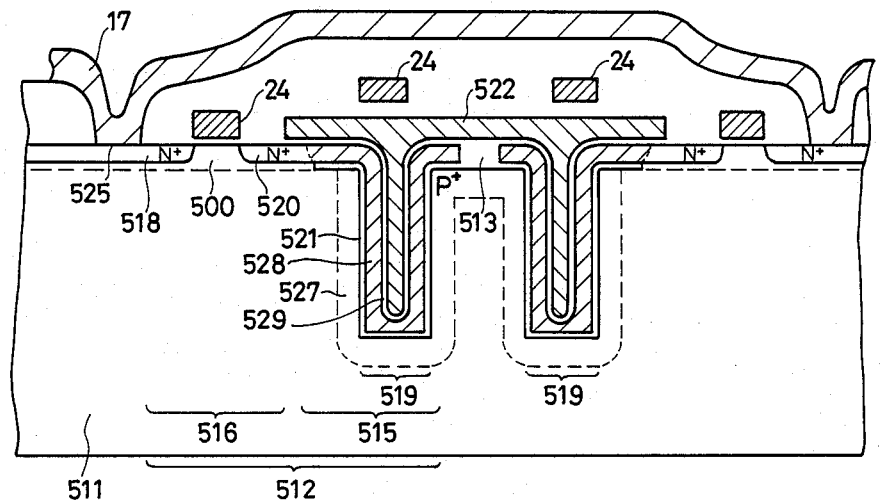
Figure 19:
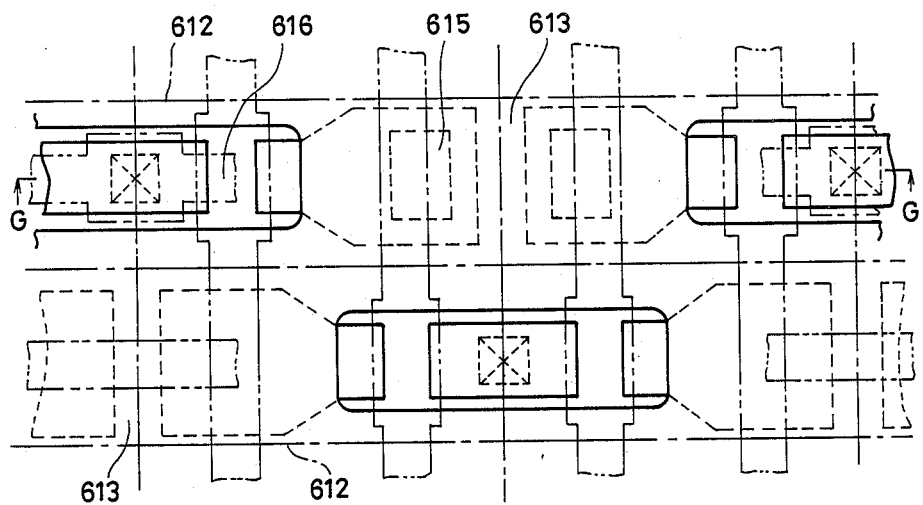
Figure 20:
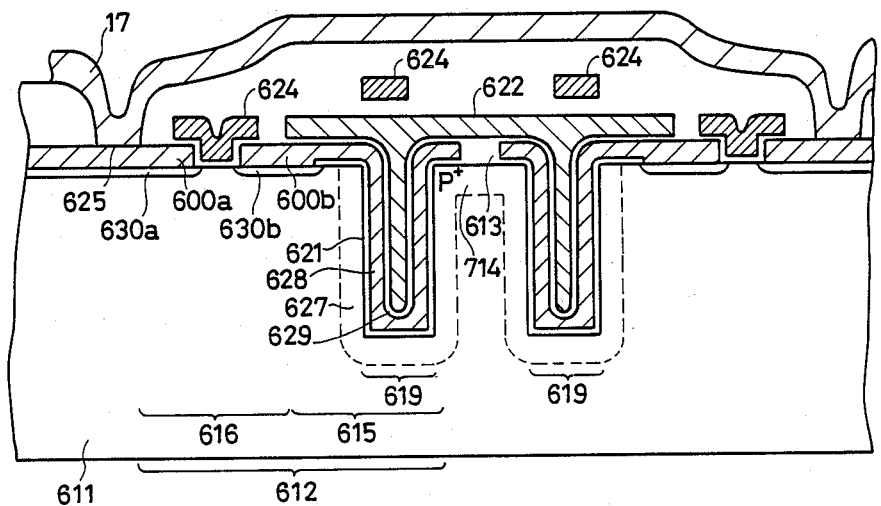
Figure 21:
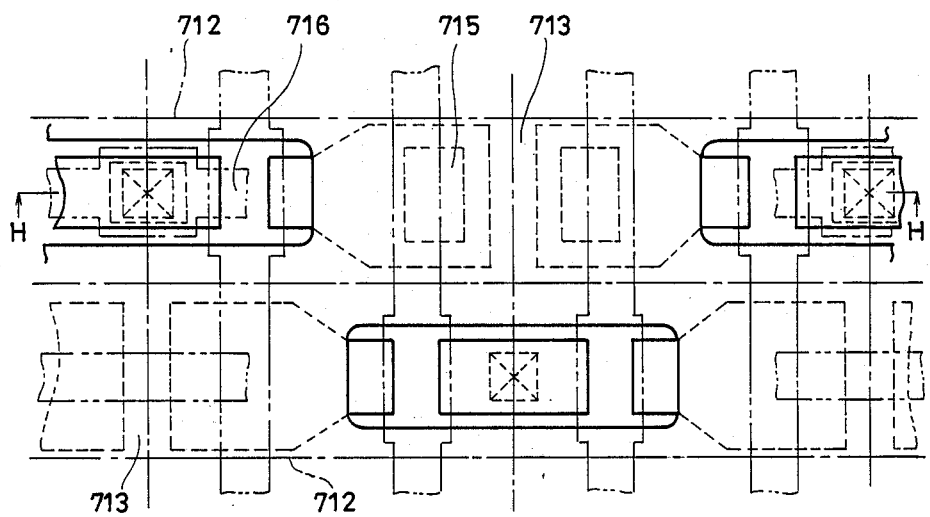
Figure 22:
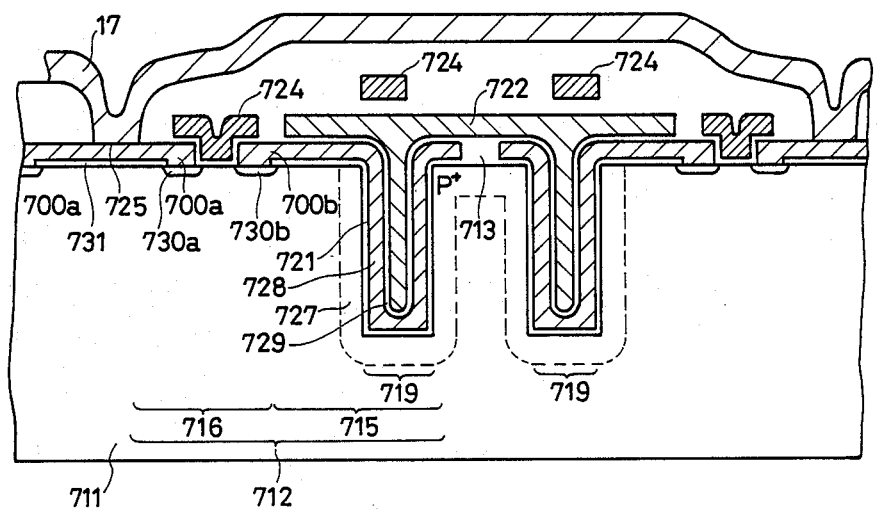
Figure 23:
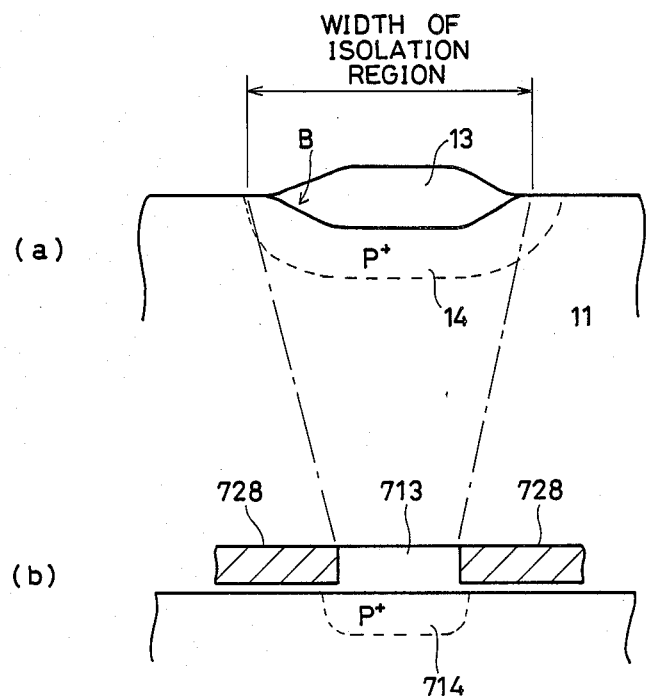

FIG. 9 a cross sectional view of the dynamic RAM shown in FIG. 8;

FIG. 10 is a plan view of a dynamic RAM according to still another embodiment of the present invention;

FIG. 11 is a cross sectional view of the dynamic RAM shown in FIG. 10;

FIG. 12 is a partially enlarged view of the cross sectional view shown in FIG. 11;

FIG. 13 is a plan view of a dynamic RAM according to still another embodiment of the present invention;

FIG. 14 is a cross sectional view of the dynamic RAM shown in FIG. 13;

FIGS. 15A to 15F are cross sectional views for explaining process steps of a method for manufacturing the dynamic RAM shown 14;

FIG. 16 is a plan view of a dynamic RAM according to still another embodiment of the present invention;

FIG. 17 is a cross sectional view of the dynamic RAM shown in FIG. 16;

FIGS. 18A to 18G are cross sectional views for explaining process steps of a method for manufacturing the dynamic RAM shown in FIG. 17;

FIG. 19 is a plan view of a dynamic RAM according to still another embodiment of the present invention;

FIG. 20 is a cross sectional view of the dynamic RAM shown in FIG. 19;

FIG. 21 is a plan view of a dynamic RAM according to still another embodiment of the present invention;

FIG. 22 is a cross sectional view of the dynamic RAM shown in FIG. 21;

FIG. 23 is an enlarged cross sectional view showing an isolation region between memory cells in the dynamic RAM; and FIGS. 24A to 24G are cross sectional views for explaining process steps of a method for manufacturing the dynamic RAM shown in FIG. 22.

DESCRIPTION OF THE PREFERRED EMBODIMENTS

Figure 5:
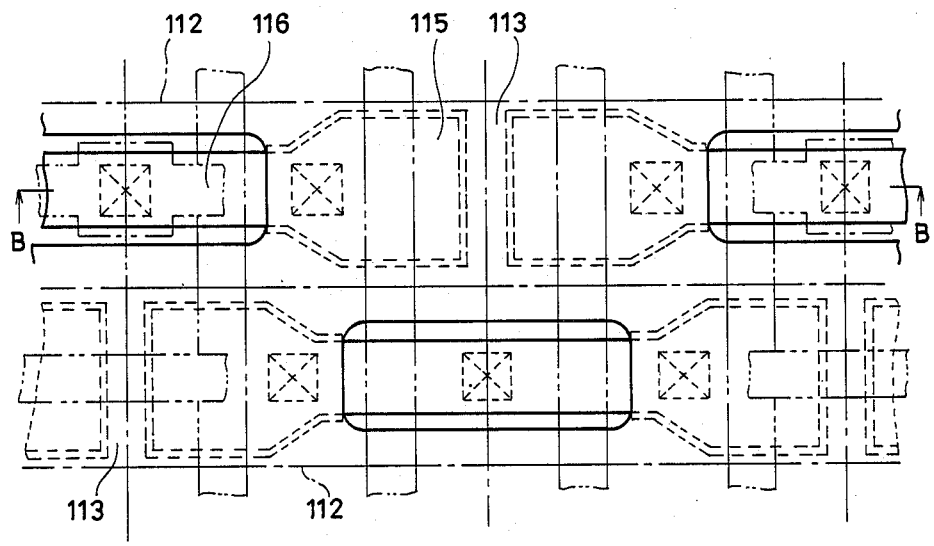
FIG. 5 is a plan view of a dynamic RAM according to an embodiment of the present invention.
Figure 6:
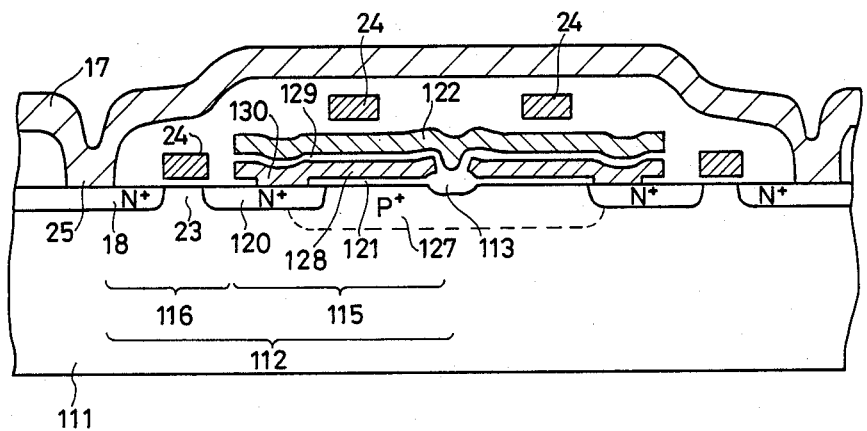
FIG. 6 is a cross sectional view of the dynamic RAM shown in FIG. 5.

FIG. 5 is a plan view of a dynamic RAM according to an embodiment of the present invention, and FIG. 6 is a cross sectional view taken along a line B-B shown in FIG. 5.

Referring to FIGS. 5 and 6, a plurality of memory cells 112 are formed on a P type silicon substrate 111. In FIG. 5, each of the memory cells 112 corresponds to a section formed by a dash and dot line. The adjacent memory cells 112 are isolated by an isolation field oxide film 113. Each of the memory cells 112 comprises a charge storage region 115 for storing charges, an access transistor region 116 and an N+ region 18 connected to a bit line 17. More specifically, the charge storage region 115 comprises a P+ region 127 formed in a part of the major surface of the P type silicon substrate 111 and serving as an opposite electrode, a first capacitor dielectric film 121 formed by, for example, oxidizing the surface of the P+ region 127, a first polysilicon (polycrystalline silicon) electrode 128 formed on the first capacitor dielectric film 121 and serving as a memory terminal of a memory capacitor, a second capacitor dielectric film 129 formed on the first polysilicon electrode 128 by, for example, oxidizing the surface of the first polysilicon electrode 128, and a second polysilicon electrode 122 formed on the second capacitor dielectric film 129 and serving as a cell plate electrode. In addition, the access transistor region 116 comprises N+ regions 18 and 120, a channel region 23 therebetween, and a word line 24 constituting a gate electrode. The first polysilicon electrode 128 is connected to the N+ region 120 through a contact hole 130, and the bit line 17 is connected to the N+ region 18 through a contact hole 25.

Figure 7:
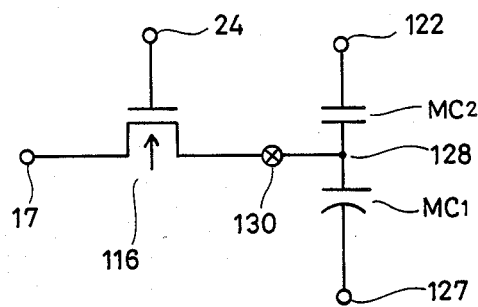
FIG. 7 is an equivalent circuit diagram for explaining the principle of operation according to the embodiment shown in FIG. 6.

FIG. 7 is an equivalent circuit diagram for explaining the principle of operation according to the embodiment shown in FIG. 6.

Referring now to FIG. 7, description is made on the principle of the embodiment shown in FIG. 6. In FIG. 6, the P+ region 127 and the first polysilicon electrode 128 which are opposed to each other with the first capacitor dielectric film 121 interposed therebetween constitute a first memory capacitor MC1 (in FIG. 7), and the first polysilicon electrode 128 and the second polysilicon electrode 122 which are opposed to each other with the second capacitor dielectric film 129 interposed therebetween constitute a second memory capacitor MC2 (in FIG. 7). More specifically, the memory cell shown in FIG. 6 has a structure in which the second memory capacitor MC2 is stacked on the first memory capacitor MC1 with the first polysilicon electrode 128 which are a common electrode layer serving as a memory terminal interposed therebetween. Thus, the memory cell comprises the two memory capacitors MC1 and MC2 connected in parallel as shown in the equivalent circuit diagram of FIG. 7. More specifically, capacitance as a whole of the memory cell 112 is the sum of capacitances of the first memory capacitor MC1 and the second memory capacitor MC2. Thus, large capacitance of memory capacitors can be ensured while maintaining the same planar area occupied by the memory capacitors as that occupied by the conventional memory capacitors.

Referring now to FIG. 6, description is made on write/read operation of data stored in the memory cell 112. At the time of writing data, when a predetermined potential is applied to the word line 24, an inversion layer is formed in the channel region 23, so that the N+ regions 18 and 120 are rendered conductive. Thus, charge from the bit line 17 is transferred to the charge storage region 115 through the channel region 23 and stored in the first polysilicon electrode 128 which is a common electrode layer serving as a memory terminal through the N+ region 120 and the contact hole 130. On the other hand, at the time of reading out data, the charge stored in the first polysilicon electrode 128 is provided to the exterior through the channel region 23 inverted by application of a predetermined potential to the word line 24, the N+ region 18 and the bit line 17.

As described in the foregoing, according to the embodiment shown in FIG. 6, since the second polysilicon electrode 122 serving as a cell plate electrode and the P+ region 127 serving as an opposite electrode are provided over and under the common electrode layer comprising the first polysilicon electrode 128 so that the second memory capacitor MC2 is stacked on the first memory capacitor MC1, large capacitance of the memory capacitor can be obtained as a whole. However, if the concentration of the P+ region 127 is low, a depletion layer formed around the N+ region 120 expands, so that capacitance of the first memory capacitor MC1 comprising the P+ region 127 and the first polysilicon electrode 128 is decreased. In order to prevent such decrease in capacitance, the concentration of the P+ region 127 must be more than approximately $10^{18}/cm^3$.

Furthermore, according to the memory cell shown in FIG. 6, the P+ region 127 corresponding to the opposite electrode of the first memory capacitor MC1 has the same conductivity type as that of the P type silicon substrate 111, so that no PN junction is formed therebetween. Therefore, leakage never occurs between the adjacent memory cells, unlike the conventional memory cells shown in FIG. 4. Thus, the distance between the adjacent memory cells can be reduced to the minimum value determined by processing limits, which can significantly contribute to high integration density of the memory cells.

Figure 1:
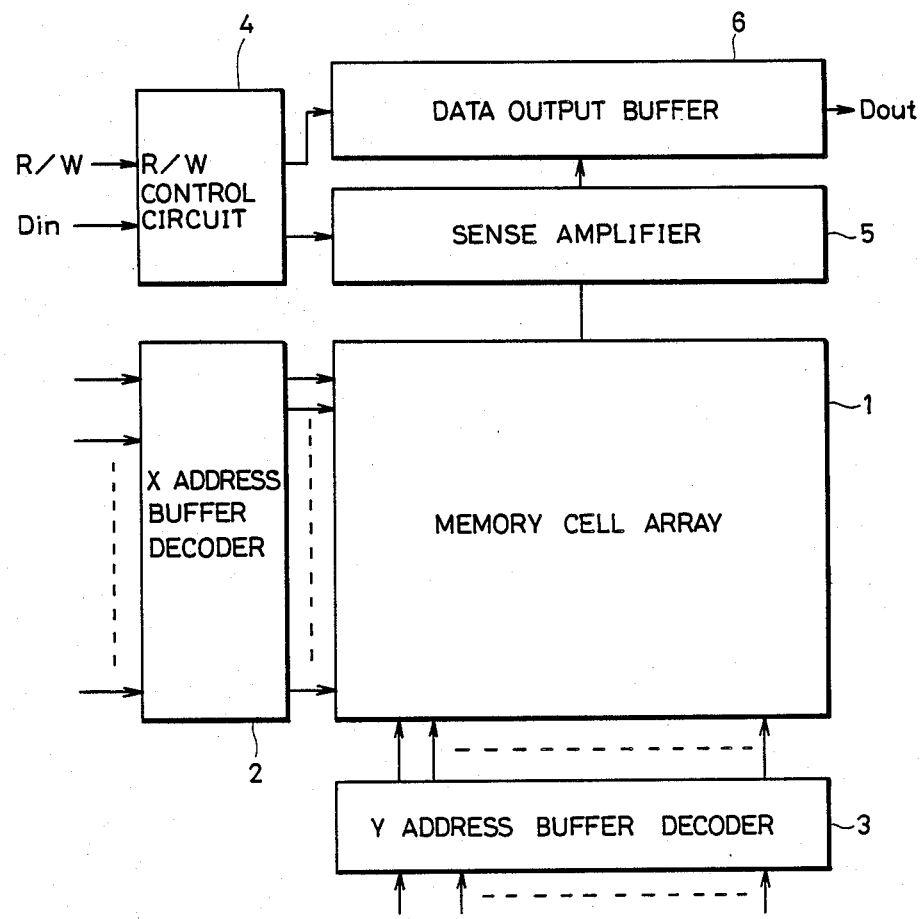
Figure 2:
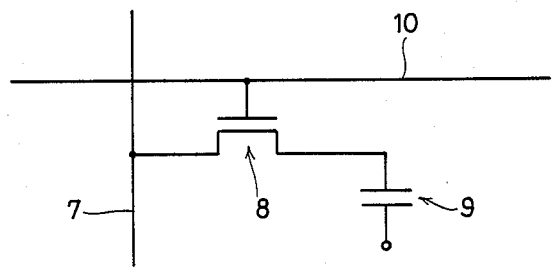
Figure 3:
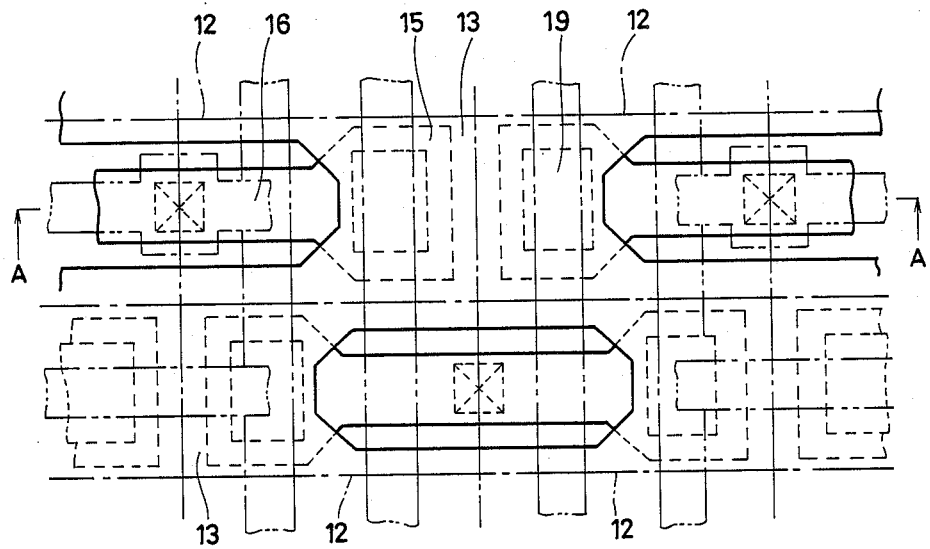
FIG. 3 is a plan view of a conventional dynamic RAM using trench memory cells.
Figure 4:
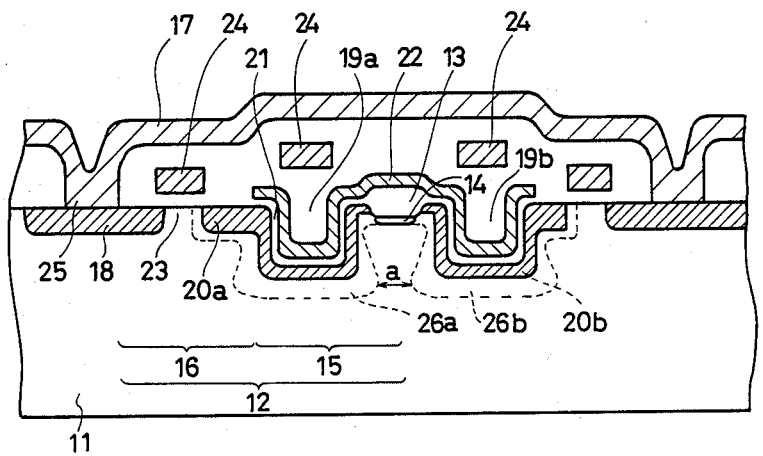
FIG. 4 is a cross sectional view of the dynamic RAM shown in FIG. 3.

Additionally, since the first polysilicon electrode 128 serving as a memory terminal of the memory capacitor is isolated from the P type silicon substrate 111 by the first capacitor dielectric film 121, soft errors in which carriers produced in the silicon substrate by alpha rays or the like flow into the memory terminal of the memory capacitor and destroy the original memory information do not occur, unlike the conventional memory cells shown in FIG. 4.

FIG. 8 is a plan view of a dynamic RAM according to another embodiment of the present invention, and FIG. 9 is a cross sectional view taken along a line C-C shown in FIG. 8. The embodiment shown in FIGS. 8 and 9 is the same as the embodiment shown in FIGS. 5 and 6 except for the following. More specifically, a charge storage region 215 in a memory cell 212 shown in FIG. 9 comprises a trench 219 formed in the major surface of a P type silicon substrate 211, a P+ region 227 formed in the substrate 211 on the side of the bottom surface and side surface of the trench 219 and serving as an opposite electrode, a first capacitor dielectric film 221 formed by, for example, oxidizing the surface of the P+ region 227, a first polysilicon electrode 228 formed on the first capacitor dielectric film 221 and serving as a memory terminal of a memory capacitor, a second capacitor dielectric film 229 formed on the first polysilicon electrode 228 by, for example, oxidizing the surface of the first polysilicon electrode 228, and a second polysilicon electrode 222 formed on the second capacitor dielectric film 229 and serving as a cell plate electrode. An N+ region 220 corresponding to a drain of an access transistor 216 is connected to the first polysilicon electrode 228 through a contact hole 230. In addition, adjacent memory cells 212 are isolated by an isolation field oxide film 213.

More specifically, in the memory cell shown in FIG. 9, the P+ region 227 and the first polysilicon electrode 228 which are opposed to each other with the first capacitor dielectric film 229 interposed therebetween constitute a first memory capacitor MC1, and the first polysilicon electrode 228 and the second polysilicon electrode 223 which are opposed to each other with the second capacitor dielectric film 229 interposed therebetween constitute a second memory capacitor MC2. Thus, the memory cell shown in FIG. 9 has a structure in which the second memory capacitor MC2 is stacked on the first memory capacitor MC1 with the first polysilicon electrode 228 which is a common electrode layer interposed therebetween, as in the embodiment shown in FIG. 6, the equivalent circuit thereof being the same as the circuit shown in FIG. 7. In other words, in the embodiment shown in FIG. 9, a double memory capacitor structure shown in FIG. 6 is applied to the conventional trench memory cells shown in FIG. 4.

Thus, according to the embodiment shown in FIG. 9, the trench structure and the double stacked structure of memory capacitors are combined, so that larger capacitance of the memory capacitors can be ensured while maintaining the small area occupied by memory cells. In addition, punch-through and soft error never occur, as in the embodiment shown in FIG. 6.

However, according to the embodiments shown in FIGS. 6 and 9, in order to connect the first polysilicon electrodes 128 and 228 respectively to the N+ regions 120 and 220 each corresponding to a drain of the access transistor, contact holes 130 and 230 are formed. In order to form such contact holes, a photolithographic process is required on the first capacitor dielectric films 121 and 221 which are extremely thin. More specifically, pollution by impurities and damage of the capacitor dielectric films which are caused by employing photoresist cannot be avoided, so that it is likely that the electrical reliability of the capacitor dielectric films is decreased.

FIGS. 10 and 11 illustrate still another embodiment of the present invention, in which such decrease of the electrical reliability of the capacitor dielectric films can be prevented. More specifically, FIG. 10 is a plan view of a dynamic RAM according to the present embodiment, and FIG. 11 is a cross sectional view taken along a line D-D shown in FIG. 10. The embodiment shown in FIGS. 10 and 11 is the same as the embodiment shown in FIGS. 5 and 6 except for the following. More specifically, a first polysilicon electrode 328 serving as a memory terminal of a charge storage region 315 in a memory cell 312 shown in FIG. 11 is connected to an N+ region 320 corresponding to a drain of an access transistor 316 in a self-aligning manner.

FIG. 12 is an enlarged cross sectional view showing the state in which the first polysilicon electrode 328 shown in FIG. 11 is connected to the N+ region 320 by self-alignment, i.e., in a self-aligning manner. Referring to FIG. 12, description is schematically made on a method for making connection in a self-aligning manner.

A first polysilicon electrode pattern 328 is formed on a first capacitor dielectric film 321 formed by, for example, oxidizing of the surface of a P type silicon substrate 311. A polysilicon layer (not shown) is deposited on the first polysilicon electrode pattern 328 and then, the polysilicon layer is etched by anisotropic etching such as reactive ion etching, so that a polysilicon electrode 330 having a sidewall shape is left in the end of the first polysilicon electrode 328. More specifically, the first polysilicon electrode 328 and the N+ region 320 are connected through the polysilicon electrode 330.

As described in the foregoing, according to the embodiment shown in FIG. 11, since the first capacitor dielectric film 321 is protected by deposition of the first polysilicon electrode 328 and then, the first polysilicon electrode 328 and the N+ region 320 are connected by the polysilicon electrode 330 by self-alignment, a contact hole need not be formed in the first capacitor dielectric film 321, so that it is not likely that the electrical reliability of the capacitor dielectric film is decreased. In addition, since the contact hole need not be formed, the area occupied by memory cells can be further reduced.

FIG. 13 is a plan view of a dynamic RAM according to still another embodiment of the present invention, and FIG. 14 is a cross sectional view taken along a line E-E shown in FIG. 13. In the embodiment shown, connection is made by self-alignment between the first polysilicon electrode and the N+ region in the silicon substrate (FIG. 11) and is applied to the memory capacitor structure according to the embodiment shown in FIG. 9. More specifically, in a memory cell 412 shown in FIG. 14, a first polysilicon electrode 428 serving as a memory terminal of a charge storage region 415 is connected by self-alignment to an N+ region 420 corresponding to the drain of an access transistor 416 through a third polysilicon electrode 430. The connection is made in the manner described with reference to FIG. 12.

Description is now made on a method for manufacturing the memory cell shown in FIG. 14. FIGS. 15A to 15F are cross section views for explaining process steps of a method for manufacturing the memory cell 412 shown in FIG. 14.

Figure 15A:
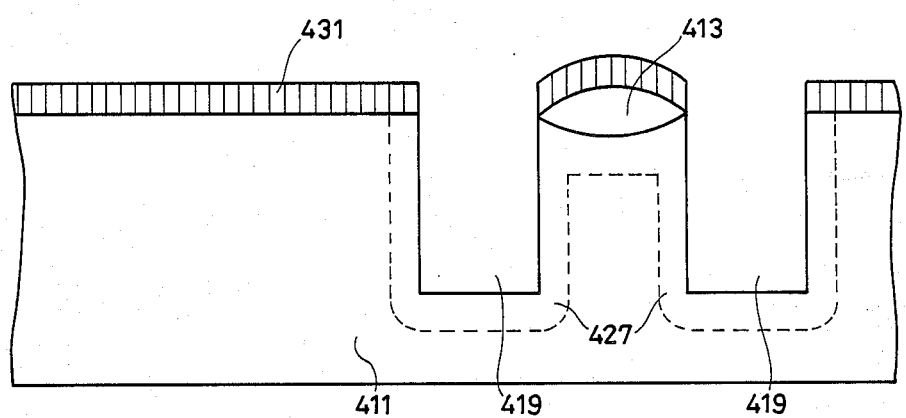

Referring now to FIG. 15A, a field oxide film 413 for isolating memory cells 412 is formed on the surface of a P type silicon substrate 411, and then a resist pattern 431 is formed to have an opening for defining a desired trench region. The silicon substrate 411 is etched through the opening defined by the resist pattern so that a trench 419 having a predetermined depth is formed. Thereafter, P type impurities are doped into the side surface and the bottom surface in the trench so that a P+ region 427 is formed.

Figure 15B:
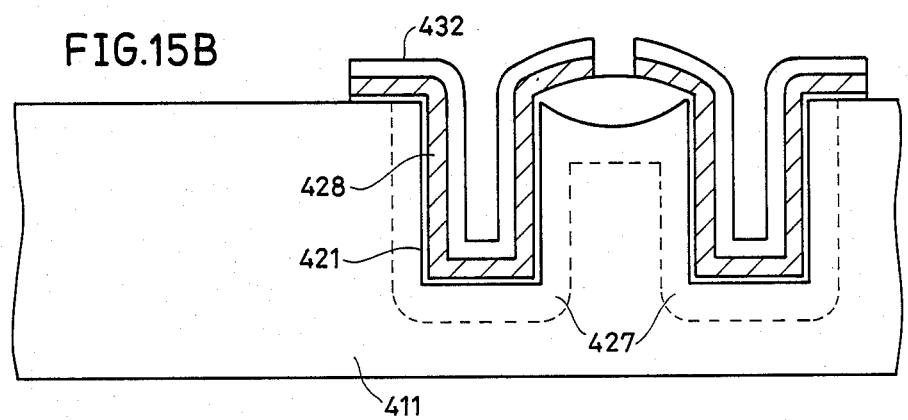

Referring next to FIG. 15B, the resist pattern 431 is removed, and then the surface of the P+ region 427 is, for example, oxidized so that a first capacitor dielectric film 421 is formed. In addition, a polysilicon layer is formed on the first capacitor dielectric film 421. A first polysilicon electrode pattern 428 is formed by a resist pattern 432.

Figure 15C:
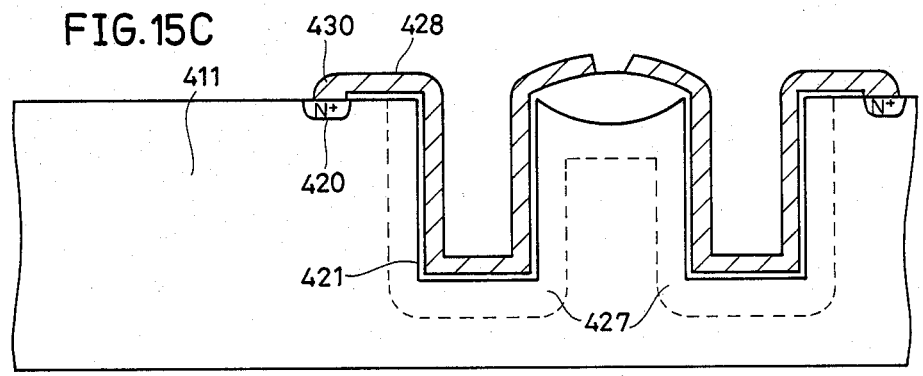

In FIG. 15C, an N+ region 420 is formed in the end of the first polysilicon electrode 428, and then a polysilicon layer (not shown) is further formed on the first polysilicon electrode pattern 428. The polysilicon layer is etched by reactive ion etching, so that a polysilicon electrode 430 having a sidewall shape is left in the end of the first polysilicon electrode 428. Therefore, a self-aligning contact 430 for connecting the first polysilicon electrode 428 and the N+ region 420 is formed.

In FIG. 15D, the surfaces of the polysilicon electrodes 428 and 430 are oxidized so that a second capacitor dielectric film 429 is formed. In addition, a polysilicon layer is formed on the second capacitor dielectric film 429. A second polysilicon electrode pattern 422 is formed by a resist pattern 433.

Referring next to FIG. 15E, a word line 24 serving as a gate electrode of an access transistor 416 is formed, ions are implanted utilizing the word line 24 as a mask, an N+ region 420 serving as a drain region is expanded and an N+ region 18 serving as a source region is formed.

Finally, in FIG. 15F, a contact hole 25 and a bit line 17 are formed, so that the memory cell 412 is completed.

As described in the foregoing, according to the embodiment shown in FIG. 14, the trench structure and the double stacked structure of the memory capacitors are combined, so that large capacitance of the capacitors can be ensured while maintaining the small area occupied by the memory cells and decrease of the electrical reliability of the capacitor dielectric films can be prevented.

FIG. 16 is a plan view of a dynamic RAM according to still another embodiment of the present invention, and FIG. 17 is a cross section view taken along a line F-F shown in FIG. 16. Referring to FIG. 17, a charge storage region 515 in a memory cell 512 comprises a trench 519 formed in the major surface of a P type silicon substrate 511, a P+ region 527 formed in the substrate 511 on the side of the bottom surface and the side surface of the trench 519, a first capacitor dielectric film 521 formed by, for example, oxidizing the surface of the P+ region 527, a first polysilicon electrode 528 formed on the first capacitor dielectric film 521 and serving as a memory terminal of a memory capacitor, a second capacitor dielectric film 529 formed on the first polysilicon electrode 528 by, for example, oxidizing the surface of the first polysilicon electrode 528, and a second polysilicon electrode 522 formed on the second capacitor dielectric film 529 and serving as a cell plate electrode. An epitaxial layer 500 is formed simultaneously with formation of the first polysilicon electrode 528. An access transistor region 516 is formed in the epitaxial layer 500.

More specifically, since the first polysilicon electrode 528 serving as a memory terminal of the memory capacitor is formed as the same layer as an N+ region 520 corresponding to a drain region of the access transistor, the first polysilicon electrode 528 and the N+ region 520 are connected without requiring a contact hole.

Description is now made on a method for manufacturing the memory cell shown in FIG. 17. FIGS. 18A to 18G are diagrams for explaining process steps of a method for manufacturing the memory cell 512 shown in FIG. 17.

Figure 18A:
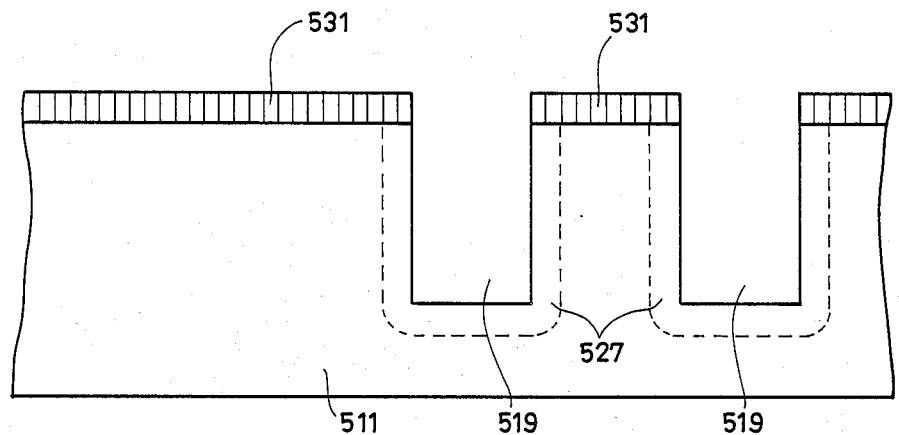

Referring now to FIG. 18A, a resist pattern 531 having an opening for defining a desired trench region is formed on the major surface of a P type silicon substrate 511. The silicon substrate 511 is etched through the opening defined by the resist pattern so that a trench 519 having a predetermined depth is formed. Thereafter, P type impurities are doped into the side surface and the bottom surface in the trench so that a P+ region 527 is formed.

Figure 18B:
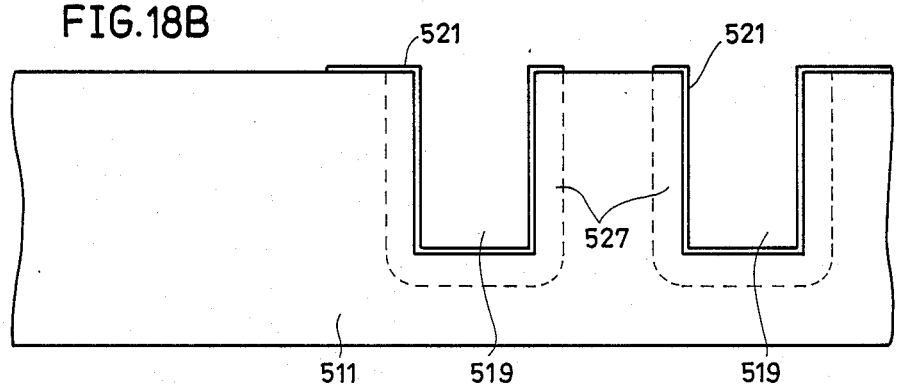

Referring now to FIG. 18B, a first capacitor dielectric film 521 is formed by, for example, oxidizing the surface of the P type silicon substrate 511.

Figure 18C:
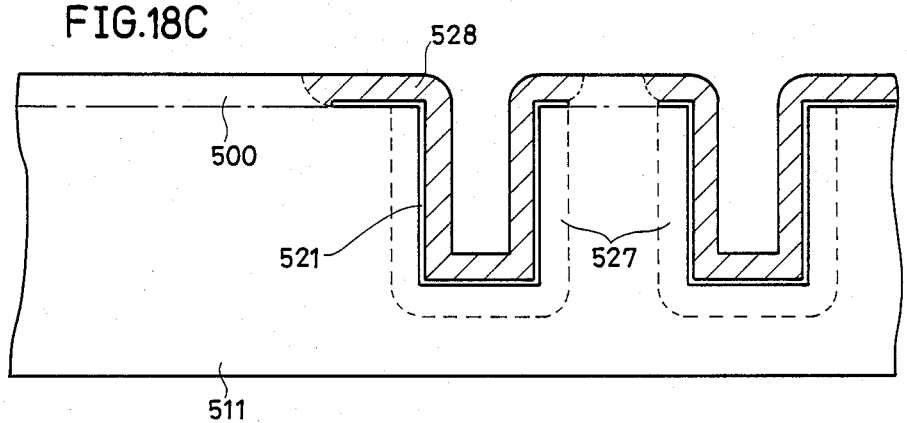

Referring now to FIG. 18C, a first polysilicon electrode pattern 528 is formed on the first capacitor dielectric film 521 and at the same time, an epitaxial layer 500 is grown on an access transistor region on the surface of the P type silicon substrate 511.

Figure 18D:
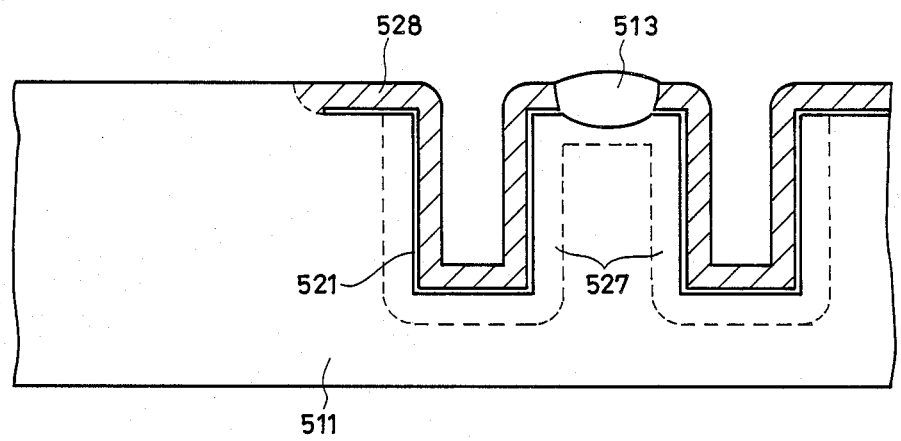

Referring now to FIG. 18D, a field oxide film 513 for isolating memory cells 512 is formed.

Figure 18E:
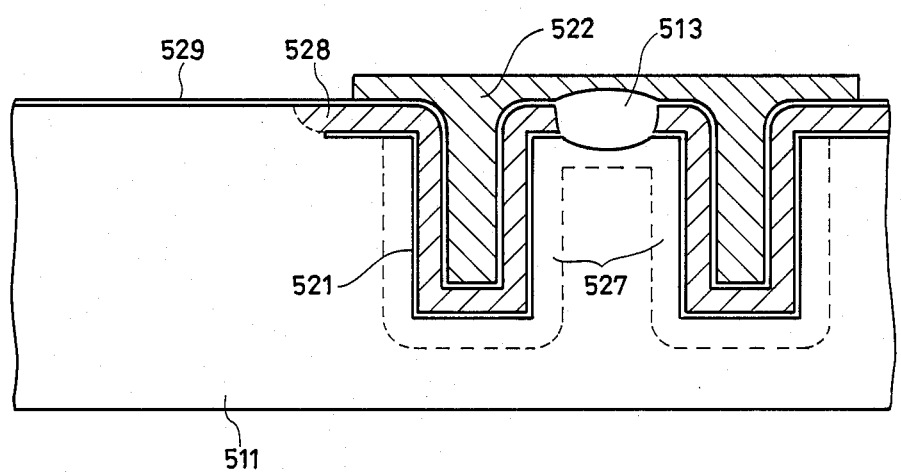

Referring now to FIG. 18E, the surfaces of the first polysilicon electrode 528 and the epitaxial layer 500 are oxidized so that a second capacitor dielectric film 529 is formed. In addition, a second polysilicon electrode pattern 522 is formed on the second capacitor dielectric film 529.

Figure 18F:
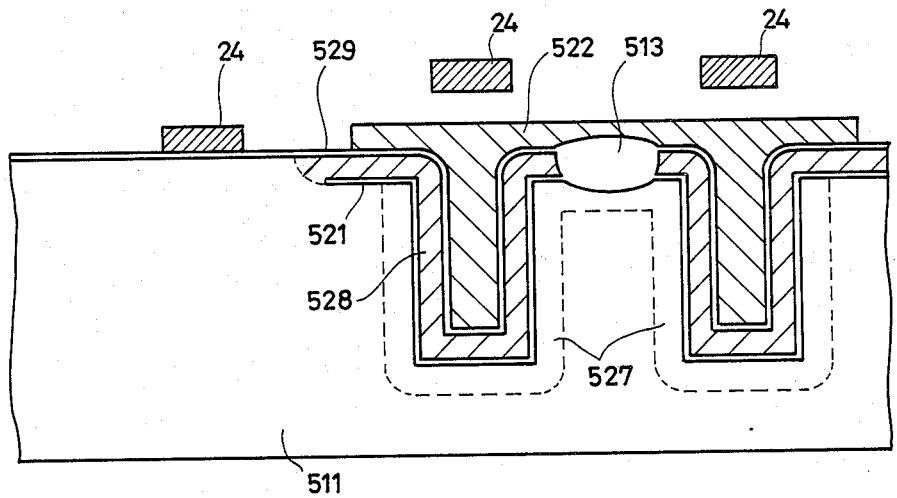

Referring now to FIG. 18F, a word line 24 serving as a gate electrode of an access transistor 516 is formed.

Figure 18G:
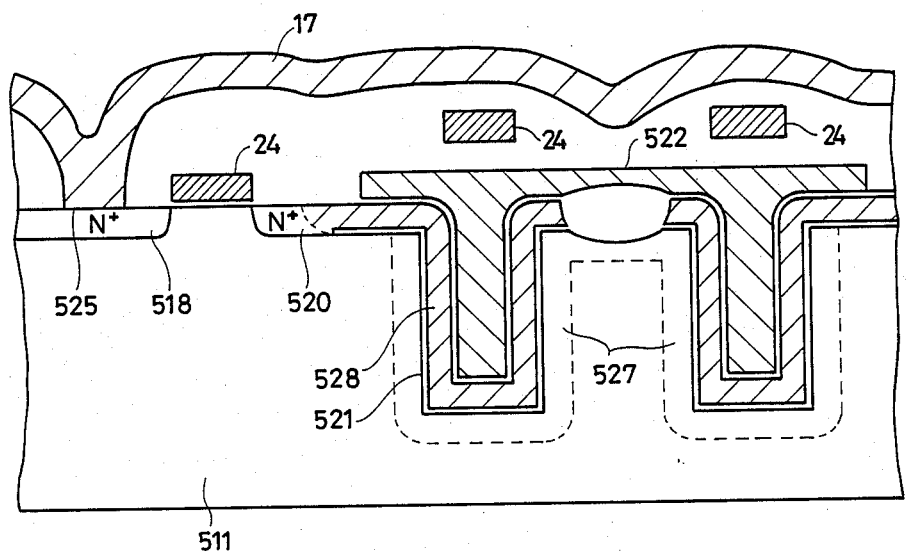

Referring now to FIG. 18G, ions are implanted utilizing the word line 24 as a mask so that an N+ region 520 serving as a drain region of the access transistor and an N+ region 518 serving as a source region are formed. Thereafter, a contact hole 525 and a bit line 17 are formed, so that a memory cell 512 is completed.

As described in the foregoing, according to the embodiment shown in FIG. 17, since the first polysilicon electrode 528 servicing as a memory terminal of the memory capacitor and the N+ region 520 serving as a drain region of the access transistor are formed as the same layer, a contact hole need not be formed in the first capacitor dielectric film 521. Thus, it is not likely that the electric reliability of the capacitor dielectric films is de decreased. In addition, the trench structure and the double stacked structure of the memory capacitors are combined, so that large capacitance of the memory capacitors can be ensured while maintaining the small area of the memory cells.

FIG. 19 is a plan view of a dynamic RAM according to still another embodiment of the present invention, and FIG. 20 is a cross sectional view taken along a line G-G shown in FIG. 19. Referring to FIG. 20, a charge storage region 615 in a memory cell 612 comprises a trench 619 formed in the major surface of a P type silicon substrate 611, a P+ region 627 formed in a substrate 611 on the side of the bottom surface and the side surface of the trench 619, a first capacitor dielectric film 621 formed by, for example, oxidizing the surface of the P+ region 627, a first polysilicon electrode 628 formed on the first capacitor dielectric film 621 and serving as a memory terminal of a memory capacitor, a second capacitor dielectric film 629 formed by, for example, oxidizing the surface of the first polysilicon electrode 628 and a second polysilicon electrode 622 serving as a cell plate electrode. Polysilicon layers 600a and 600b are formed simultaneously with formation of the first polysilicon electrode 628, the polysilicon layer 600a corresponding to an electrode of a source region 630a of an access transistor and the polysilicon layer 600b corresponding to an electrode of a drain region 630b. More specifically, impurity ions are implanted into the polysilicon layer 600 formed on the silicon substrate 611 and then, the polysilicon layer in a portion corresponding to the bottom portion of a gate electrode 624 is removed. Thereafter, impurities are diffused into the silicon substrate 611 from the polysilicon layers 600a and 600b by heat treatment so that the source region 630a and the drain region 630b of the access transistor are formed by self-alignment with layers 600a and 600b. By the term 'in registration with' is meant that the second electrode region is concentric and coterminous with the contact portion of the common electrode layer taking into account inherent lateral diffusion of the second electrode region within the substrate. For example, whereas the width of the contact portion of the common electrode layer may in practice be on the order of 0.3 micron, the corresponding width of the second electrode region of the transistor may be greater by on the order of 0.1 micron as a result of lateral diffusion of impurity within the substrate. Thus, the drain region 630b is concentric and approximately coterminous with layer 600b, i.e., the ends of region 630b extend only somewhat beyond the ends of layer 600b as a result of unintentional lateral diffusion of impurity in the substrate due to process limitation. More specifically, since the first polysilicon electrode 628 serving as a memory terminal of the memory capacitor is coupled to the N+ region 630 of the access transistor through the polysilicon layer 600 which is the same layer as the first polysilicon electrode 628, the first polysilicon electrode 628 and the N+ region 630 are connected without requiring a contact hole. Thus, according to the embodiment shown in FIG. 20, a contact hole need not be formed in the first capacitor dielectric film 621, so that it is not likely that the electrical reliablility of the capacitor dielectric film is decreased. In addition, the trench structure and the double stacked structure of memory capacitors are combined, so that large capacitance of the memory capacitor can be ensured while maintaining the small area of the memory cells.

Additionally, FIG. 21 is a plan view showing a variation of the dynamic RAM shown in FIG. 19, and FIG. 22 is a cross sectional view taken along a line H-H shown in FIG. 21. The structure shown in FIG. 22 is the same as the structure shown in FIG. 20 except for the following. An insulating film 731 comprising a silicon oxide film is formed in a portion corresponding to a contact hole 725 on a P type silicon substrate 711, and a first capacitor dielectric film 721 is expanded on the side of gate electrode 724. More specifically, a junction region is not formed in a region under the insulation films 731. Thus, the respective junction areas of a source region 730a and a drain region 730b are substantially reduced. Therefore, occurrence of soft error in a so-called bit line mode in which charge produced in the P type silicon substrate 711 by alpha particles or the like flows into the source region and the drain region so that memory information is destroyed can be significantly controlled.

Therefore, junction capacitance of the source region 730a and the drain region 730b serving as parasitic capacitance of a bit line 17 is substantially decreased. Thus, a read signal $V_S$ represented by the following equation is increased:

$$V_S = \frac{C_S}{C_S + C_B} V_C$$

($C_S$ is capacitance of the memory cell, $C_B$ is capacitance of the bit line, and $V_C$ is voltage of the memory cell) Therefore, a memory device which is immune to noise and has a large operating margin, for example, a large noise margin and sensitivity to a voltage fluctuation or an ambient temperature change, can be achieved.

Furthermore, referring to FIG. 22, since the gate electrode 724 has both ends which are provided on the polysilicon electrodes 700a and 700b, respectively, the width of the gate electrode 724 itself can be held large while decreasing the spacing between both the polysilicon electrodes 700a and 700b, so that wiring resistance of the gate electrode 724 can be decreased.

Additionally, in FIG. 22, a thick insulating film 713 is embedded between first polysilicon electrode patterns so that an isolation region between memory cells is formed.

FIG. 23(a) is a cross sectional view showing an isolation region between memory cells in the conventional dynamic RAM as shown in, for example, FIG. 4. As shown in FIG. 23(a), in the conventional memory cells, an LOCOS (local oxidation of silicon) isolation process utilizing selective oxidation process was widely used to form the isolation region. However, in this method, formation of a bird's beak (represented by an arrow B in FIG. 23(a)) by lateral growth of an oxide film cannot be avoided, so that there was a limit in the size of the oxide film so as to decrease the width of the isolation region.

However, in the embodiment shown in FIG. 22, polysilicon layer patterns 728 are formed and then, an impurity doping region 714 is formed by ion implantation or the like in a region where no polysilicon layer is formed. In addition, an insulating film 713 such as an oxide film is embedded so that an isolation region is formed (FIG. 23(b)). According to such a method, because the bird's beak as shown in FIG. 23(a) never occurs, the width of the isolation region can be decreased to a minimum size determined by a photolithographic technique.

Description is now made on a method for manufacturing the memory cell shown in FIG. 22. FIGS. 24A to 24G are cross sectional views for explaining process steps of a method for manufacturing the memory cell 712 shown in FIG. 22.

Figure 24A:
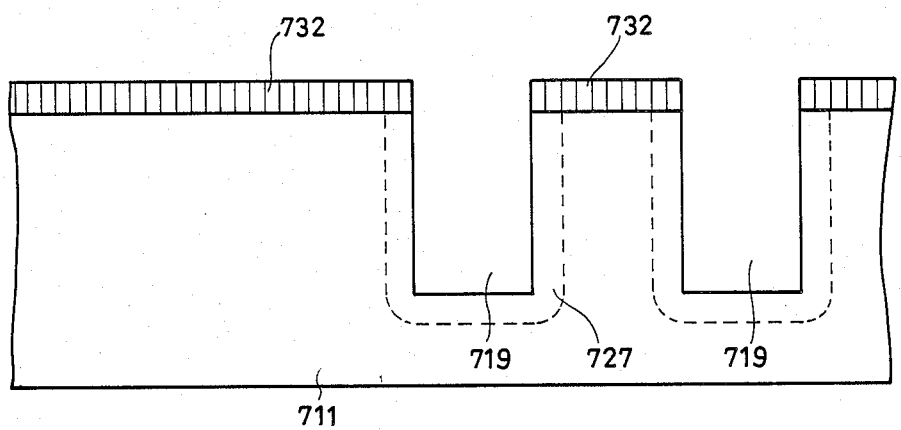

Referring now to FIG. 24A, a resist pattern 732 having an opening for defining a desired trench region is formed on the surface of a P type silicon substrate 711. The silicon substrate 711 is etched through the opening defined by the resist pattern so that a trench 719 having a predetermined depth is formed. Thereafter, P type impurities such as boron are doped into the side surface and the bottom surface in the trench so that a P+ region 727 is formed.

Figure 24B:
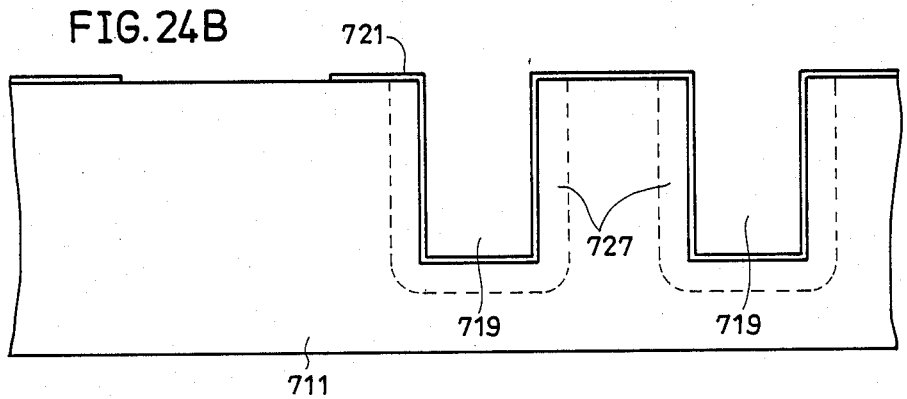

Referring next to FIG. 24B, the surface of the P type silicon substrate 711 is oxidized so that a first capacitor dielectric film 721 is formed.

Figure 24C:
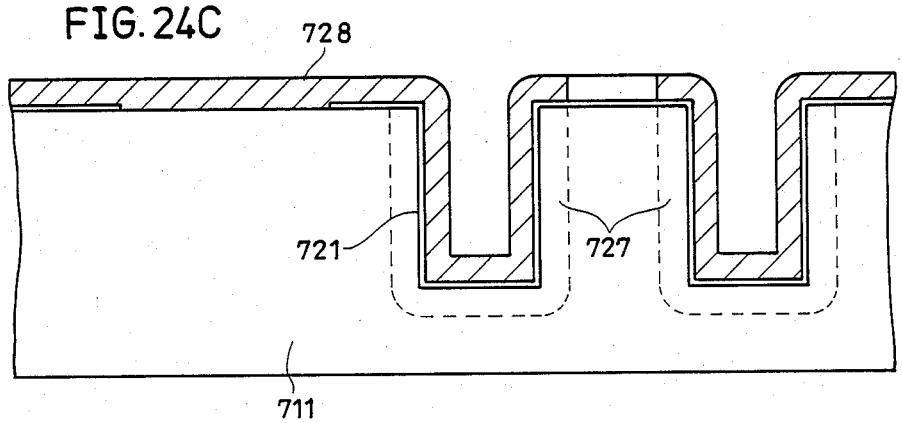

In FIG. 24C, a first polysilicon electrode pattern 728 is formed on the P type silicon substrate 711, and N type impurities are doped into the first polysilicon electrode.

Figure 24D:
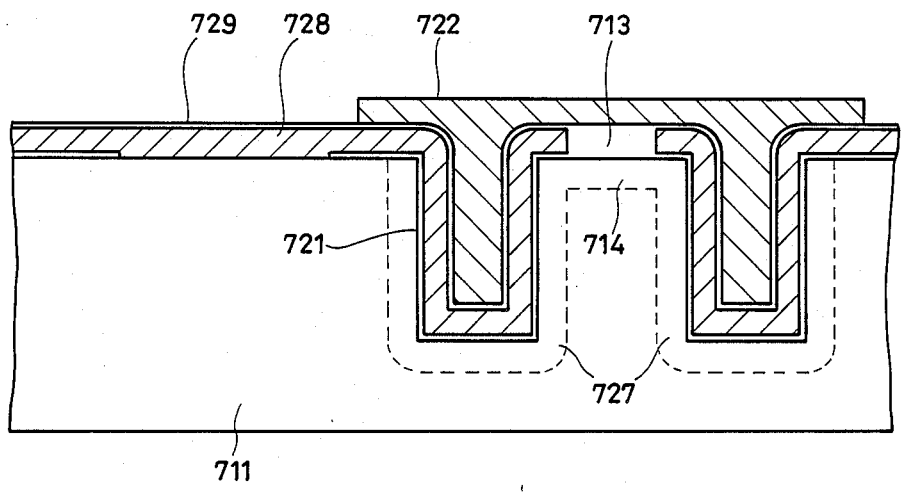

Then, in FIG. 24D, boron is implanted into a region between the first polysilicon electrode patterns in the adjacent memory cells so that an impurity doping region 714 is formed. An oxide film 713 is embedded on the impurity doping region 714 by high temperature oxidation and flattened so that an isolation region is formed. A second capacitor dielectric film 729 is formed by, for example, oxidizing the surface of the first polysilicon electrode 728 and then, a second polysilicon electrode pattern 722 is formed on the second capacitor dielectric film 729 as a cell plate.

Figure 24E:
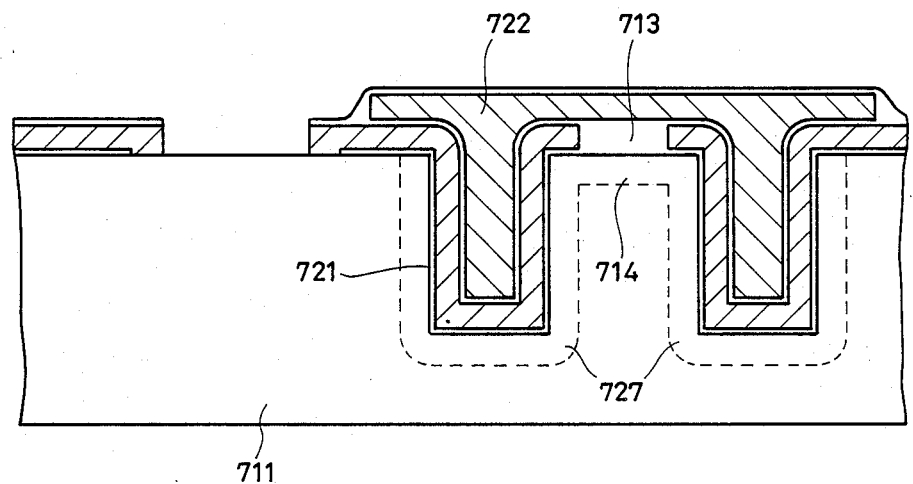

Referring next to FIG. 24E, a polysilicon layer in a portion corresponding to a channel region of an access transistor is removed.

Figure 24F:
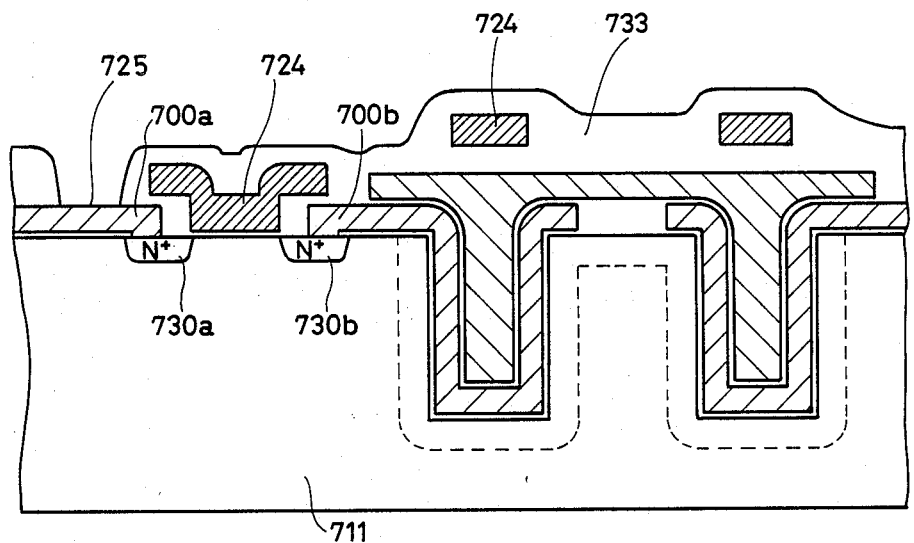

In FIG. 24F, a gate oxide film is formed on the above described channel region, and an insulating film 733 is formed on the other region by high temperature oxidation. Thereafter, a word line 724 serving as a gate electrode is formed in a predetermined pattern, and an insulating layers is formed on the word line 724 by high temperature oxidation. In addition, a contact hole 725 is formed. During such heat treatment, a source region 730a and a drain region 730b of the access transistor are formed by diffusing impurities from polysilicon layers 700a and 700b.

Figure 24G:
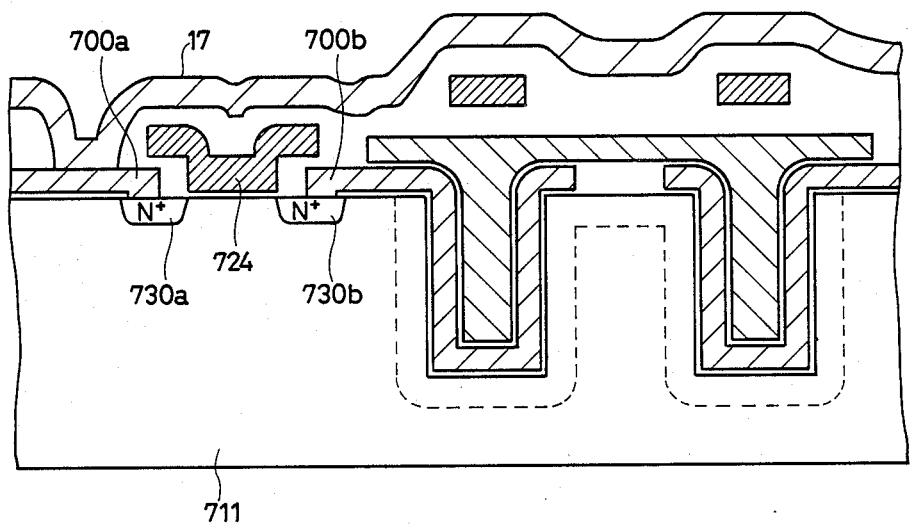

Finally, in FIG. 24G, a bit line 17 is formed, so that a memory cell 712 is completed.

As described in the foregoing, according to the embodiment shown in FIG. 22, since the first polysilicon electrode 728 is coupled to an N+ region 730 of the access transistor through a polysilicon layer 700 which is the same layer as the first polysilicon electrode 728, the first polysilicon electrode 728 and the N+ region 730 are connected without requiring a contact hole. Thus, a contact hole need not be formed in the first capacitor dielectric film 721, so that it is not likely that the electrical reliability of the capacitor dielectric film is decreased. Furthermore, according to the embodiment shown in FIG. 22, occurrence of soft error in a so-called bit line mode can be significantly controlled and the width of the isolation region can be decreased to a minimum size determined by photolithographic techniques, so that still higher integration density can be provided.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a semiconductor substrate of a first conductivity type,
a plurality of word lines and a plurality of bit lines formed on said semiconductor substrate to intersect with each other, and
memory cells formed at intersections of said word lines and said bit lines, each of said memory cells comprising charge storage means, a single read/write transistor and means for connecting said charge storage means and said transistor,
said charge storage means comprising
a common electrode layer formed on said semiconductor substrate,
first and second memory capacitors stacked on said semiconductor substrate to be opposed to each other with said common electrode layer interposed therebetween,
said transistor comprising
a first electrode region of a second conductivity type formed on the surface of said semiconductor substrate and connected to one of said bit lines,
a second electrode region of the second conductivity type formed, spaced apart from said first electrode region, on the surface of said semiconductor substrate, and
a control electrode formed on a region between said first electrode region and said second electrode region and corresponding to one of said plurality of word lines, said connecting means comprising a contact portion of said common electrode layer connecting said common electrode layer to the second electrode region of said transistor 2. A semiconductor memory device according to claim 1, wherein said second electrode region is beneath and in registration with a said contact portion of said common electrode layer.

3. A semiconductor memory device according to claim 1, wherein said second electrode region is formed by diffusion into said substrate of an impurity through said contact portion of said common electrode layer.

4. A semiconductor memory device according to claim 1, wherein said electrode contact portion of said common electrode layer is coplanar with said second electrode region of said transistor.

5. A semiconductor memory device according to claim 1, wherein common electrode layers of adjacent ones of said charge storage means are spaced apart from each other on said substrate, and wherein said device includes an isolation region formed by an insulating material on said substrate between said common electrode layers.

6. A semiconductor memory device according to claim 5, including a cell plate electrode formed through an insulation layer on said common electrode layer, said isolation region underlying said cell plate electrode.

7. A semiconductor memory device, comprising:
a semiconductor substrate of a first conductivity type,
a plurality of word lines and a plurality of bit lines formed on said semiconductor substrate to intersect with each other, and
memory cells formed at intersections of said word lines and said bit lines, each of said memory cells comprising charge storage means, a single read/write transistor and means for connecting said charge storage means and said transistor,
said charge storage means comprising
a common electrode layer formed on said semiconductor substrate,
first and second memory capacitors stacked on said semiconductor substrate to be opposed to each other with said common electrode layer interposed therebetween,
wherein common electrode layers of adjacent ones of said charge storage means are spaced apart from each other on said substrate, and wherein said device includes an isolation region formed by an insulating material on said substrate between said common electrode layers.

8. A semiconductor memory device according to claim 7, wherein said charge storage means includes a cell plate electrode formed through an insulation layer on said common electrode layer, said isolation region underlying said cell plate electrode.

9. A semiconductor memory device, comprising:
a semiconductor substrate of a first conductivity type,
a plurality of word lines and a plurality of bit lines formed on said semiconductor substrate to intersect with each other, and
memory cells formed at intersections of said word lines and bit lines, each of said memory cells comprising charge storage means, a single read/write transistor and means for connecting said charge storage means and said transistor,
said charge storage means comprising
a common electrode layer formed on said semiconductor substrate,
first and second memory capacitors stacked on said semiconductor substrate to be opposed to each other with said common electrode layer interposed therebetween,
said transistor comprising
a first electrode region of a second conductivity type formed on the surface of said semiconductor substrate and connected to one of said bit lines,
a second electrode region of the second conductivity type formed, spaced apart from said first electrode region, on the surface of said semiconductor substrate, and
a control electrode formed on a region between said first electrode region and said second electrode region and corresponding to one of said plurality of word lines,
said connecting means comprising a contact portion of said common electrode layer self aligned with and connected to said second electrode region of said transistor.

10. A semiconductor memory device comprising:
a semiconductor substrate of a first conductivity type,
a plurality of word lines and a plurality of bit lines formed on said semiconductor substrate to intersect with each other, and
memory cells formed at intersections of said word lines and said bit lines, each of said memory cells comprising charge storage means, a single read/write transistor and means for connecting said charge storage means and said transistor,
said charge storage means comprising
a common electrode layer formed on said semiconductor substrate, and
first and second memory capacitors stacked on said semiconductor substrate to be opposed to each other with said common electrode layer interposed therebetween,
said transistor comprising
a first electrode region of a second conductivity type formed on the surface of said semiconductor substrate and connected to one of said bit lines,
a second electrode region of the second conductivity type formed, spaced apart from said first electrode region, on the surface of said semiconductor substrate, and
a control electrode formed on a region between said first electrode region and said second electrode region and corresponding to one of said plurality of word lines,
said connecting means comprising an electrode self alignment with said common electrode layer for connecting said common electrode layer to the second electrode region of said transistor.

11. A semiconductor memory device according to claim 10, wherein
said first memory capacitor comprises
an electrode region of the first conductivity type formed on the surface of said semiconductor substrate,
a first capacitor dielectric film formed on said electrode region, and
said common electrode layer formed on said first capacitor dielectric film,
said second memory capacitor comprises said common electrode layer,
a second capacitor dielectric film formed on said common electrode layer, and
a cell plate electrode formed on said second capacitor dielectric film.

12. A semiconductor memory device according to claim 10, wherein a trench is formed in the charge storage region of said semiconductor substrate,
said first memory capacitor comprising,
an electrode region of the first conductivity type formed on the surface of said semiconductor substrate including the side surface and the bottom surface of said trench,
a first capacitor dielectric film formed on said electrode region, and
said common electrode layer formed on said first capacitor dielectric film,
said second memory capacitor comprising
said common electrode layer,
a second capacitor dielectric film formed on said common electrode layer, and
cell plate electrode formed on said second capacitor dielectric film.

13. A semiconductor memory device according to claim 10, wherein said connecting electrode comprises an electrode formed on the second electrode region of said transistor and having a sidewall shape which is in contact with an end of said common electrode layer.

14. A semiconductor memory device according to claim 10, wherein both said common electrode layer and said connecting electrode are formed of polysilicon.

15. A semiconductor memory device according to claim 10, which further comprises a region for isolating adjacent memory cells.

16. A semiconductor memory device comprising:
a semiconductor substrate of a first conductivity type,
a plurality of word lines and a plurality of bit lines formed on said semiconductor substrate to intersect with each other, and
memory cells formed at intersections of said word lines and said bit lines, each of said memory cells comprising charge storage means and a single read/write transistor connected to said charge storage means,
said charge storage means comprising
a common electrode layer formed on said semiconductor substrate, and
first and second memory capacitors stacked on said semiconductor substrate to be opposed to each other with said common electrode layer interposed therebetween,
said transistor comprising
a semiconductor layer of the first conductivity type formed on said semiconductor substrate as the same layer as said common electrode layer,
a first electrode region of a second conductivity type formed on the surface of said semiconductor layer and connected to one of said bit lines,
a second electrode region of the second conductivity type formed on the surface of said semiconductor layer to be spaced apart from said first electrode region and in contact with said common electrode layer, and
a control electrode formed on a region between said first electrode region and said second electrode region and corresponding to one of said plurality of word lines.

17. A semiconductor memory device according to claim 16, wherein
said first memory capacitor comprises
an electrode region of the first conductivity type formed on the surface of said semiconductor substrate,
a first capacitor dielectric film formed on said electrode region, and
said common electrode layer formed on said first capacitor dielectric film, and
said second memory capacitor comprises
said common electrode layer,
a second capacitor dielectric film formed on said common electrode layer, and
a cell plate electrode formed on said second capacitor dielectric film.

18. A semiconductor memory device according to claim 16, wherein a trench is formed in the charge storage region of said semiconductor substrate,
said first memory capacitor comprising
an electrode region of the first conductivity type formed on the surface of said semiconductor substrate including the side surface and the bottom surface of said trench,
a first capacitor dielectric film formed on said electrode region, and
said common electrode layer formed on said first capacitor dielectric film,
said second memory capacitor comprising
said common electrode layer,
a second capacitor dielectric film formed on said common electrode layer, and
a cell plate electrode formed on said second capacitor dielectric film.

19. A semiconductor memory device according to claim 16, wherein said common electrode layer comprises a polysilicon layer.

20. A semiconductor memory device according to claim 19, wherein said semiconductor layer comprises an epitaxial layer formed as the same layer as said polysilicon layer.

21. A semiconductor memory device according to claim 16, which further comprises a region for isolating adjacent memory cells.

22. A semiconductor memory device comprising:
a semiconductor substrate of a first conductivity type,
a plurality of word lines and a plurality of bit lines formed on said semiconductor substrate to intersect with each other, and
memory cells formed at intersections of said word lines and said bit lines, each of said memory cells comprising charge storage means and a read/write transistor connected to said charge storage means,
said charge storage means comprising
a common electrode layer formed on said semiconductor substrate, and
first and second memory capacitors stacked on said semiconductor substrate to be opposed to each other with said common electrode layer interposed therebetween,
said transistor comprising
a first electrode layer formed as the same layer as said common electrode layer and to be connected to said common electrode layer, on said semiconductor substrate,
a second electrode layer formed as the same layer as said common electrode layer and spaced apart from said common electrode layer and connected to one of said bit lines, on said semiconductor substrate, a first electrode region of a second conductivity type formed in said semiconductor substrate under said first electrode layer, a second electrode region of the second conductivity type formed in said semiconductor substrate under said second electrode layer, and a control electrode formed on a region between said first electrode region and said second electrode region and corresponding to one of said plurality of word lines.

23. A semiconductor memory device according to claim 22, wherein said first memory capacitor comprises an electrode region of the first conductivity type formed on the surface of said semiconductor substrate, a first capacitor dielectric film formed on said electrode region, and said common electrode layer formed on said first capacitor dielectric film, and said second memory capacitor comprises said common electrode layer, a second capacitor dielectric film formed o said common electrode layer, and a cell plate electrode formed on said second capacitor dielectric film.

24. A semiconductor memory device according to claim 22, wherein a trench is formed in a charge storage region of said semiconductor substrate, said first memory capacitor comprising an electrode region of the first conductivity type formed on said semiconductor substrate surface including the side surface and the bottom surface of said trench, a first capacitor dielectric film formed on said electrode region, and said common electrode layer formed on said first capacitor dielectric film, said second memory capacitor comprising said common electrode layer, a second capacitor dielectric film formed on said common electrode layer, and a cell plate electrode formed on said second capacitor dielectric film.

25. A semiconductor memory device according to claim 22, wherein said common electrode layer comprises a polysilicon layer.

26. A semiconductor memory device according to claim 25, wherein said first and second electrode layers comprise a polysilicon layer formed as the same layer as said polysilicon layer.

27. A semiconductor memory device according to claim 22, wherein said second electrode region is formed in a region other than a portion where said second electrode layer and the bit line are connected.

28. A semiconductor memory device according to claim 22, wherein said control electrode has a shape in which both ends thereof are provided on said first and second electrode layers, respectively.

29. A semiconductor memory device according to claim 22, which further comprises a region for isolating adjacent memory cells.

30. A semiconductor memory device according to claim 29, wherein said isolation region is formed of an oxide film embedded between respective ends opposite to said first electrode layers, of the respective common electrode layers of the adjacent memory cells.

* * * * *